(12) United States Patent
Kim et al.

(10) Patent No.: US 7,393,738 B1
(45) Date of Patent: Jul. 1, 2008

(54) SUBGROUND RULE STI FILL FOR HOT STRUCTURE

(75) Inventors: Byeong Y Kim, LaGrangeville, NY (US); Munir D. Naeem, Poughkeepsie, NY (US); Frank D. Tamweber, Poughkeepsie, NY (US); Xiaomeng Chen, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 11/623,404

(22) Filed: Jan. 16, 2007

(51) Int. Cl.
    *H01L 21/336* (2006.01)
(52) U.S. Cl. .............. 438/198; 438/479; 257/E21.564
(58) Field of Classification Search ............ 438/198, 438/479; 257/E21.564
See application file for complete search history.

(56) References Cited

U.S. PATENT DOCUMENTS

| | | | |
|---|---|---|---|
| 6,107,125 A * | 8/2000 | Jaso et al. ................. 438/149 |
| 6,221,778 B1 | 4/2001 | Lee | |
| 6,331,459 B1 | 12/2001 | Gruening | |
| 6,512,266 B1 | 1/2003 | Deshpande et al. | |
| 6,531,377 B2 | 3/2003 | Knorr et al. | |
| 6,998,684 B2 | 2/2006 | Anderson et al. | |
| 7,250,656 B2 * | 7/2007 | Haensch et al. ............. 257/347 |
| 7,298,009 B2 * | 11/2007 | Yan et al. .................... 257/357 |
| 2001/0014513 A1 | 8/2001 | Levy | |
| 2005/0136684 A1 | 6/2005 | Mukai et al. | |
| 2005/0153519 A1 | 7/2005 | Lu et al. | |
| 2006/0076628 A1 * | 4/2006 | Anderson et al. ........... 257/373 |

FOREIGN PATENT DOCUMENTS

| | | |
|---|---|---|
| JP | 2000/031266 | 1/2000 |
| JP | 2001/118921 | 10/2001 |
| JP | 9252049 | 1/2007 |

OTHER PUBLICATIONS

U.S. Appl. No. 10/902,557, filed Jul. 24, 2004, Katherine Saenger, et al. "Dual Simox Hybrid Orientation Technology (HOT) Substrates".

* cited by examiner

*Primary Examiner*—Lex Malsawma
(74) *Attorney, Agent, or Firm*—Todd M. C. Li

(57) ABSTRACT

This invention provides a hybrid orientation (HOT) semiconductor-on-insulator (SOI) structure having an isolation region, e.g. a shallow trench isolation region (STI), and a method for forming the STI structure that is easy to control. The method of forming the isolation region includes an etch of the insulating material, selective to the semiconductor material, followed by an etch of the semiconductor material, selective to the insulating material, and then filling any high aspect ratio gaps with a CVD oxide, and filling the remainder of the STI with an HDP oxide.

18 Claims, 21 Drawing Sheets

SUBGROUND RULE STI FILL FOR HOT STRUCTURE

FIELD OF THE INVENTION

The present invention relates to high-performance metal oxide semiconductor field effect transistors (MOSFETs) for digital or analog applications, and more particularly to integrated circuit structures that take advantage of crystalline orientation dependent carrier mobility with multiple crystalline-faced structures on the same substrate.

BACKGROUND OF THE INVENTION

In present semiconductor technology, complementary metal oxide semiconductor (CMOS) devices, such as nFETs (i.e., n-channel MOSFETs) or pFETs (i.e., p-channel MOSFETs), are typically fabricated upon semiconductor wafers, such as Si, that have a single crystal orientation. In particular, most of today's semiconductor devices are built upon Si having a (100) crystal orientation.

Electrons are known to have a high mobility for a (100) Si surface orientation, but holes are known to have high mobility for a (110) surface orientation. That is, hole mobility values on (100) Si are roughly 2×-4× lower than the corresponding electron mobility for this crystallographic orientation. To compensate for this discrepancy, pFETs are typically designed with larger widths in order to balance pull-up currents against the nFET pull-down currents and achieve uniform circuit switching. pFETs having larger widths are undesirable since they take up a significant amount of chip area.

On the other hand, hole mobilities on (110) Si are 2× higher than on (100) Si; therefore, pFETs formed on a (110) surface will exhibit significantly higher drive currents than pFETs formed on a (100) surface. Unfortunately, electron mobilities on (110) Si surfaces are significantly degraded compared to (100) Si surfaces.

As can be deduced from the above, the (110) Si surface is optimal for pFET devices because of excellent hole mobility, yet such a crystal orientation is completely inappropriate for nFET devices. Instead, the (100) Si surface is optimal for nFET devices since that crystal orientation favors electron mobility.

Methods have been proposed to form such an integrated semiconductor device in which both the nFETs and the pFETs are formed on a same substrate having different crystallographic orientations.

For example, co-assigned U.S. Pat. No. 6,998,684, the disclosure of which is hereby incorporated by reference in its entirety, discloses an integrated circuit structure that has a substrate having at least two types of crystalline orientations, in which first-type transistors (e.g. NFETs) are formed on first portions of the substrate having a first type of crystalline orientation, and second-type transistors (e.g. PFETs) are formed on second portions of the substrate having a second type of crystalline orientation.

One challenge encountered in the formation of such hybrid orientation technology (HOT) devices occurs during the formation of the shallow trench isolation (STI) structures, formed to isolate the devices formed in portions of the substrate having the first type of crystalline orientation from devices formed in portions of the substrate having the second type of crystalline orientation. In particular, the formation of the trench may require controlled etching of multiple materials in a single process step, for example, when the HOT devices are formed on bulk crystalline semiconductor portion adjacent an SOI portion, which may be difficult to control, and may lead to defects that impact yield.

For the reasons discussed above, it would be desirable to form HOT semiconductor device including isolation regions between bulk and SOI devices that uses a more controllable process that will lead to improved yield.

SUMMARY OF THE INVENTION

One object of the present invention is to provide a structure for and method of fabricating integrated semiconductor devices such that one type of device with one type of crystal orientation is made on a first area and other type of device with another type of crystal orientation is made on a second area.

Another object of the present invention is to provide a structure for and method of fabricating integrated semiconductor devices such that one type of pFETs are located on a bulk substrate, adjacent to nFETs located on an SOI structure that are closely spaced, for example, as in an SRAM array.

These and other objects and advantages are achieved in the present invention by utilizing integration of multi-step selective STI etching and sub-ground rule gap filling with conformal CVD oxide.

According to one aspect of the invention, a method is provided of forming a semiconductor structure comprising the steps of: providing a substrate comprising a semiconductor on insulator (SOI) region comprising a first semiconductor material on a buried insulating layer, adjacent a bulk semiconductor region comprising a second semiconductor material, said SOI region separated from said bulk region by an insulating spacer; forming an insulating material layer atop said SOI region, said bulk region and said insulating spacer; forming a patterned mask over said insulating material layer comprising an isolation opening that exposes a region of said insulating material layer that defines an isolation region between said SOI region and said bulk semiconductor region, said isolation opening formed over said insulating spacer; performing a first etch to remove said exposed regions of said insulating material layer and an upper portion of said insulating spacer, to expose portions of said first semiconductor material and said second semiconductor material in said isolation opening, said first etch being selective to said first and second semiconductor materials, and so that said insulating spacer is recessed below the upper surfaces of said first and second semiconductor materials; then performing a second etch to remove said exposed portions of said first semiconductor material and said semiconductor material to expose portions of said buried insulating layer in said isolation opening, said second etch being selective to said insulating material layer, said buried insulating layer and said insulating spacer, such that a high aspect ratio gap, having an aspect ratio equal to or greater than about 3:1, is formed between a sidewall of said insulating spacer and said second semiconductor material; filling said high aspect ratio gap with a CVD oxide; and then filling the isolation opening with an HDP oxide to form an isolation region so that there are no voids in said isolation region.

According to another aspect of the invention, a semiconductor structure is provided comprising: a semiconductor on insulator (SOI) region comprising a first semiconductor material on a buried oxide layer; an isolation region; and a bulk semiconductor region comprising a second semiconductor material, wherein said bulk semiconductor region is separated from said SOI region by said isolation region, wherein said isolation region comprises an oxide spacer disposed on a sidewall of said buried oxide layer, and a high aspect ratio gap between said oxide spacer and said second semiconductor material, wherein said high aspect ratio gap is filled with a CVD oxide.

These and other aspects of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF THE INVENTION

Figure 1:
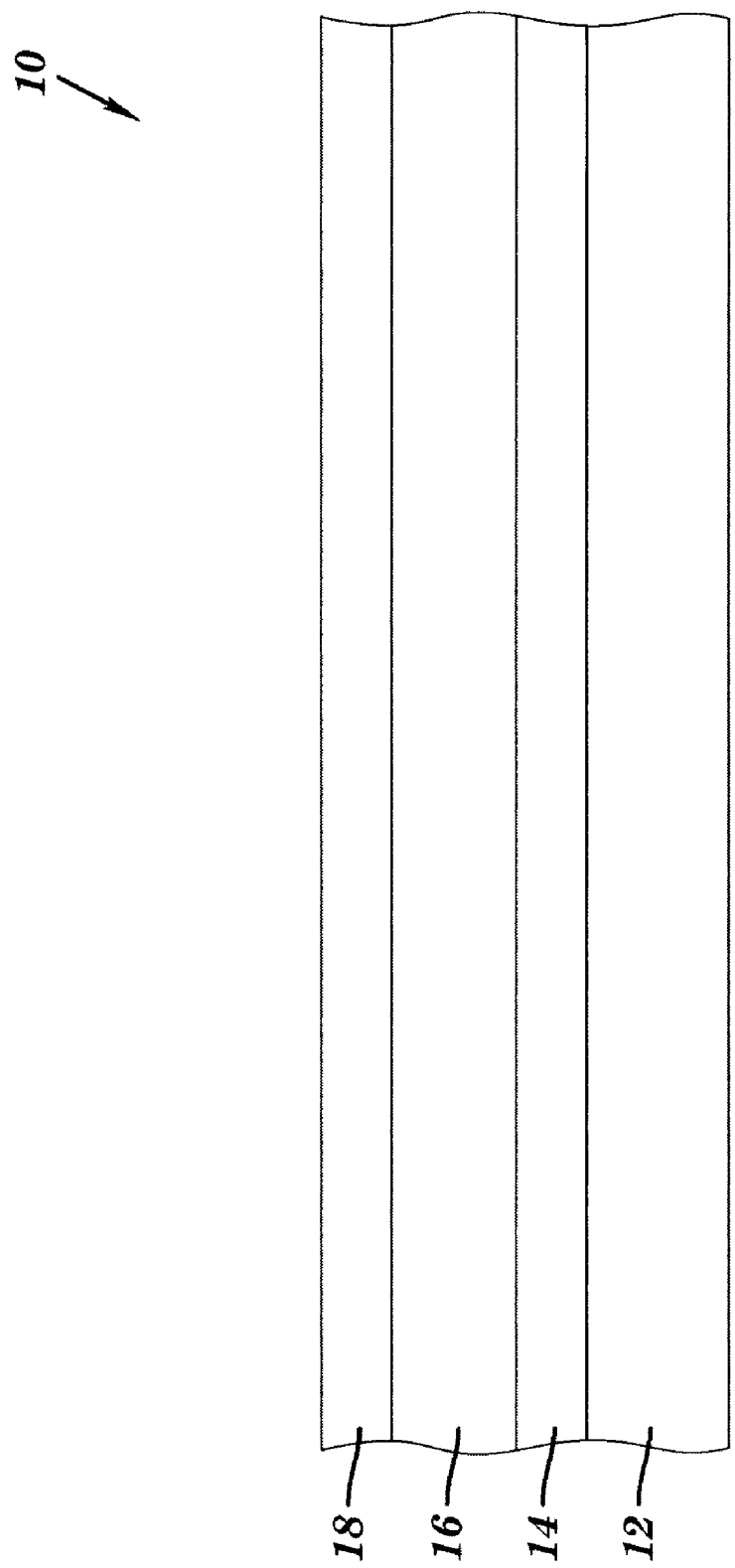
FIGS. 1-11 illustrate, in cross section views, process steps in forming a hybrid orientation (HOT) semiconductor structure including an SOI semiconductor structure and a bulk semiconductor structure.

The present invention and the various features and advantageous details thereof are explained more fully with reference to the nonlimiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the present invention. The examples used herein are intended merely to facilitate an understanding of ways in which the invention may be practiced and to further enable those of skill in the art to practice the invention. Accordingly, the examples should not be construed as limiting the scope of the invention.

The following provides a method of forming different semiconductor devices, such as NFETs and PFETs, wherein the NFETs are formed on a crystallographic surface of a first orientation, and the PFETs are located on a crystallographic orientation of a second orientation different from the first orientation. The method in accordance with the invention will now be described in greater detail by referring to the following discussion as well as the drawings that accompany the present application. In the accompanying drawings, like and correspondence elements are referred to by like reference numerals.

FIG. 1 illustrates a bonded substrate 10, i.e., hybrid substrate, which may be employed in the present invention. As shown, bonded substrate 10 includes a surface dielectric layer 18, a first semiconductor layer 16, an insulating layer 14, and a second semiconductor layer 12. The bonded substrate 10 may further include an optional third semiconductor layer (not shown) that is located beneath the second semiconductor layer 12. In the optional bonded substrate, another insulating layer separates the second semiconductor layer 12 from the optional third semiconductor layer.

The surface dielectric layer 18 of the bonded substrate 10 may be an oxide, nitride, oxynitride or other insulating layer or combinations of different insulating layers formed atop the first semiconductor layer 16 after wafer bonding by either a thermal process (i.e., oxidation, nitridation or oxynitridation) or by deposition. Notwithstanding the origin of the surface dielectric layer 18, the surface dielectric layer 18 preferably has a thickness of from about 3 to about 500 nm, with a thickness of from about 5 to about 20 nm being more highly preferred.

The first semiconductor layer 16 is comprised of any semiconducting material including, for example, Si, SiC, SiGe, SiGeC, Ge alloys, GaAs, InAs, InP as well as other III/V or II/VI compound semiconductors. First semiconductor layer 16 may also comprise an SOI layer of a preformed SOI substrate or a layered semiconductor such as, for example, Si/SiGe. The first semiconductor layer 16 is also characterized as having a first crystallographic orientation, which is preferably (100). Although a (100) crystal orientation is preferred, the first semiconductor layer 16 may have a (111), or a (110) crystal orientation.

The thickness of the first semiconductor layer 16 can be controlled during wafer bonding process. Typically, however, the first semiconductor layer 16 has a thickness of from about 5 to about 500 nm, with a thickness of from about 5 to about 100 nm being more highly preferred.

The insulating layer 14 which is located between the first semiconductor layer 16 and the second semiconductor layer 12 has a variable thickness depending upon the initial wafers used to create the bonded substrate 10. Typically, however, the insulating layer 14 has a thickness of from about 1 to about 500 nm, with a thickness of from about 50 to about 100 nm being more highly preferred. The insulating layer 14 is preferably an oxide or other like insulator material that is formed on one or both of the wafers prior to bonding.

The second semiconductor layer 12 is comprised of any semiconducting material which may be the same or different from that of the first semiconductor layer 16. Thus, second semiconductor layer 12 may include, for example, Si, SiC, SiGe, SiGeC, Ge alloys, GaAs, InAs, InP as well as other III/V or II/VI compound semiconductors. Second semiconductor layer 12 may also comprise an SOI layer of a preformed SOI substrate or a layered semiconductor such as, for example, Si/SiGe. The second semiconductor layer 12 is also characterized as having a second crystallographic orientation, which is different from the first crystallographic orientation. Since the first semiconductor layer 16 is preferably a (100) surface, the crystallographic orientation of the second semiconductor layer 12 is preferably (110). Although a (110) crystal orientation is preferred, the second semiconductor layer 12 may have a (111), or a (100) crystal structure.

The thickness of the second semiconductor layer 12 may vary depending on the initial starting wafers used to form the bonded substrate 10. Typically, however, the second semiconductor layer 12 has a thickness of from about 500 μm to about 2000 μm, with a thickness of from about 600 μm to about 1200 μm being more highly preferred for the structural support throughout semiconductor fabrication process.

When an optional third semiconductor layer is present, the optional third semiconductor layer may comprise the same or different semiconducting material as that of the first semiconductor layer 16 and the second semiconductor layer 12. When the optional third layer is present, an insulating layer separates the optional third semiconductor layer from the first semiconductor layer.

The bonded substrate 10 illustrated in FIG. 1 may be comprised of two semiconductor wafers (not shown) that are bonded together as known in the art. For example, the two wafers used in fabricating the bonded substrate 10 may include two SOI wafers, wherein one of the wafers includes the first semiconductor layer 16 and the other wafer includes the second semiconductor 12; an SOI wafer and a bulk semiconductor wafer; two bulk semiconductor wafers which both contain an insulating layer 14 thereon; or an SOI wafer and a bulk wafer which includes an ion implant region, such as a H2 implant region, which can be used to split a portion of at least one of the wafers during bonding.

Bonding may be achieved by first bringing the two wafers into intimate contact with each other; optionally applying an external force to the contacted wafers; and then heating the two contacted wafers under conditions that are capable of bonding the two wafers together. The heating step may be performed in the presence or absence of an external force. The heating step is typically performed in an inert ambient at a temperature of from about 200° to about 1050° C. for a time period of from about 2 to about 20 hours. More preferably, the bonding is performed at a temperature of from about 200° to about 400° C. for a time period of from about 2 to about 20 hours. The term "inert ambient" is used in the present invention to denote an atmosphere in which an inert gas, such as He, Ar, N2, Xe, Kr or a mixture thereof, is employed. A preferred ambient used during the bonding process is N2.

In the embodiment where two SOI wafers are employed, some material layers of at least one of the SOI wafers may be removed after bonding utilizing a planarization process such as chemical mechanical polishing (CMP) or grinding and etching.

In the embodiment in which one of the wafers includes an ion implant region, the ion implant region forms a porous region during bonding which causes a portion of the wafer above the ion implant region to break off leaving a bonded wafer. The implant region is typically comprised of $H_2$ ions which are implanted into the surface of the wafer utilizing ion implantation conditions that are well known to those skilled in the art.

In the embodiment where the wafers to be bonded do not include a dielectric layer therein, the surface dielectric layer 18 may be formed atop the bonded wafers by a thermal process, such as oxidation, or by a conventional deposition process such as chemical vapor deposition (CVD), plasma-enhanced CVD, atomic layer deposition, chemical solution deposition as well as other like deposition processes.

Figure 2:
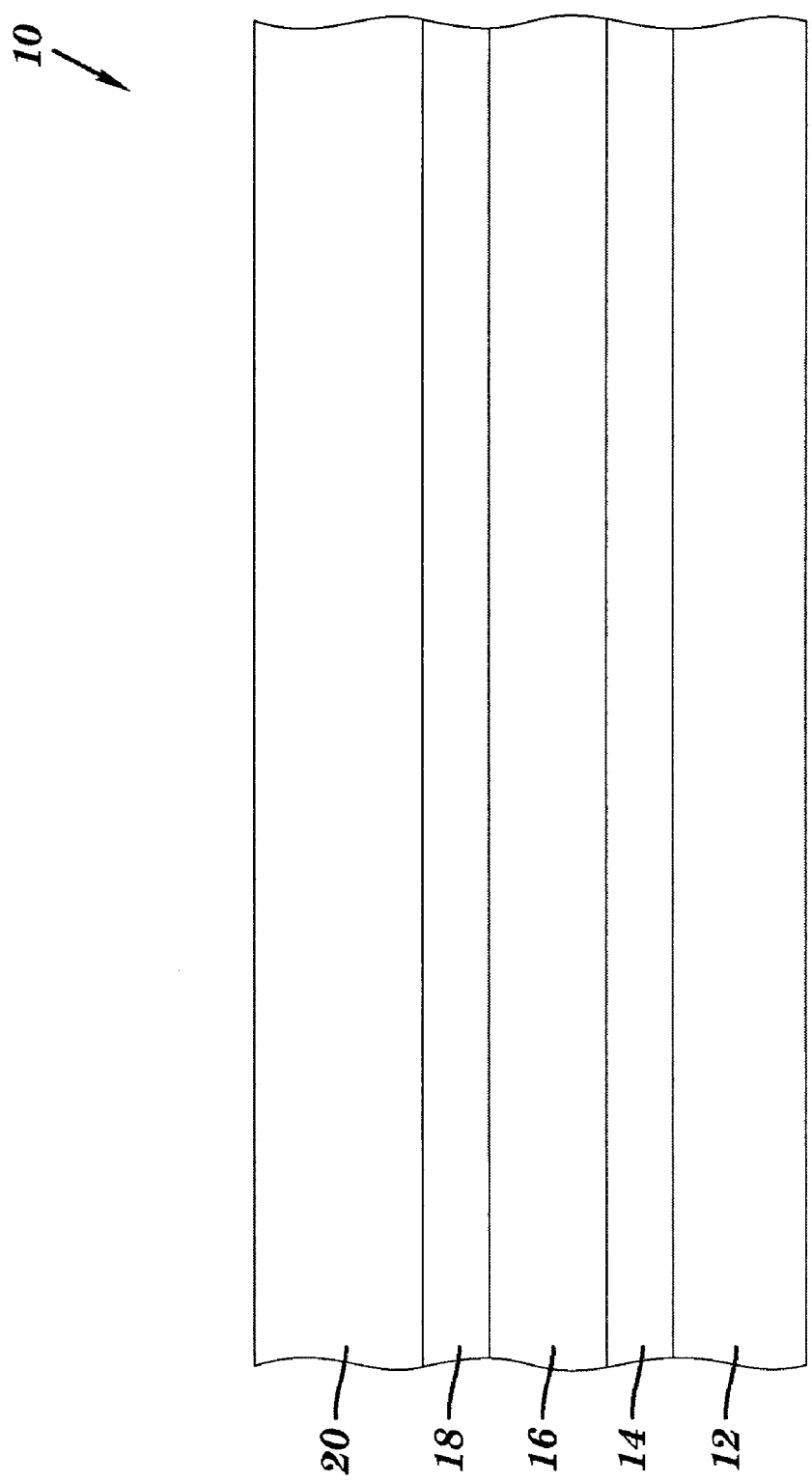
Figure 3:
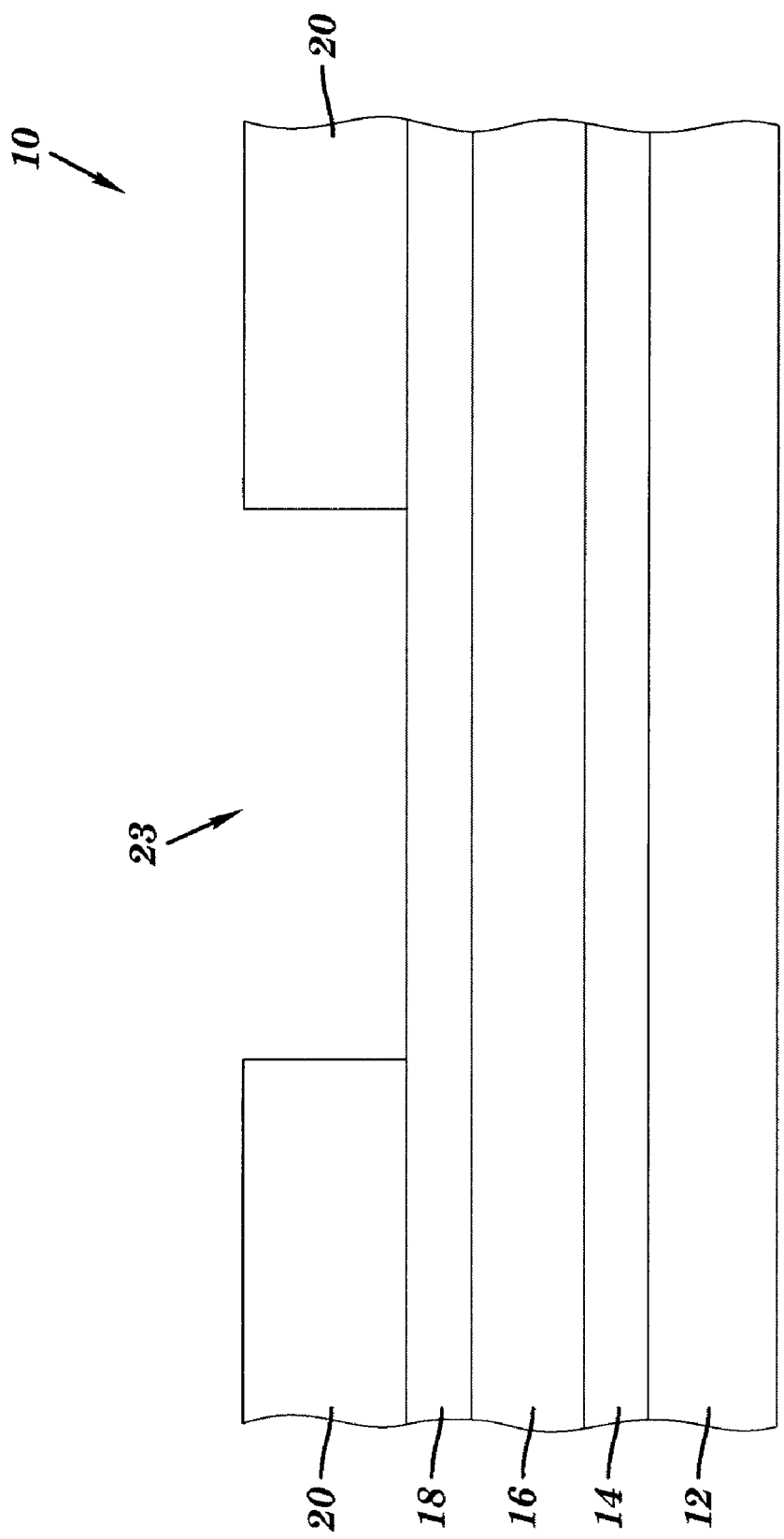

Referring to FIG. 2, mask 20 is then formed on a predetermined portion of the bonded substrate 10 so as to protect a portion of the bonded substrate 10 which defines a first device region, while leaving another portion (not shown) of the bonded substrate 10 unprotected for defining a second device region (not shown). In one embodiment, mask 20 is formed on a predetermined portion of the surface dielectric layer 18 by applying a photoresist mask to the entire surface of the bonded substrate 10. After application of the photoresist mask 20, the mask 20 is patterned by lithography to form an opening 23 in the mask, which will be used to define the hybrid orientation technology region or HOT window. The lithographic patterning includes the steps of exposing the photoresist to a pattern of radiation and developing the pattern utilizing a resist developer. The resultant structure including the mask 20 formed on a predetermined portion of the bonded substrate 10 is shown, for example, in FIG. 3.

In another embodiment mask 20 is a nitride or oxynitride layer that is formed and patterned utilizing lithography and etching to form opening 23 for defining the HOT window.

Figure 4:
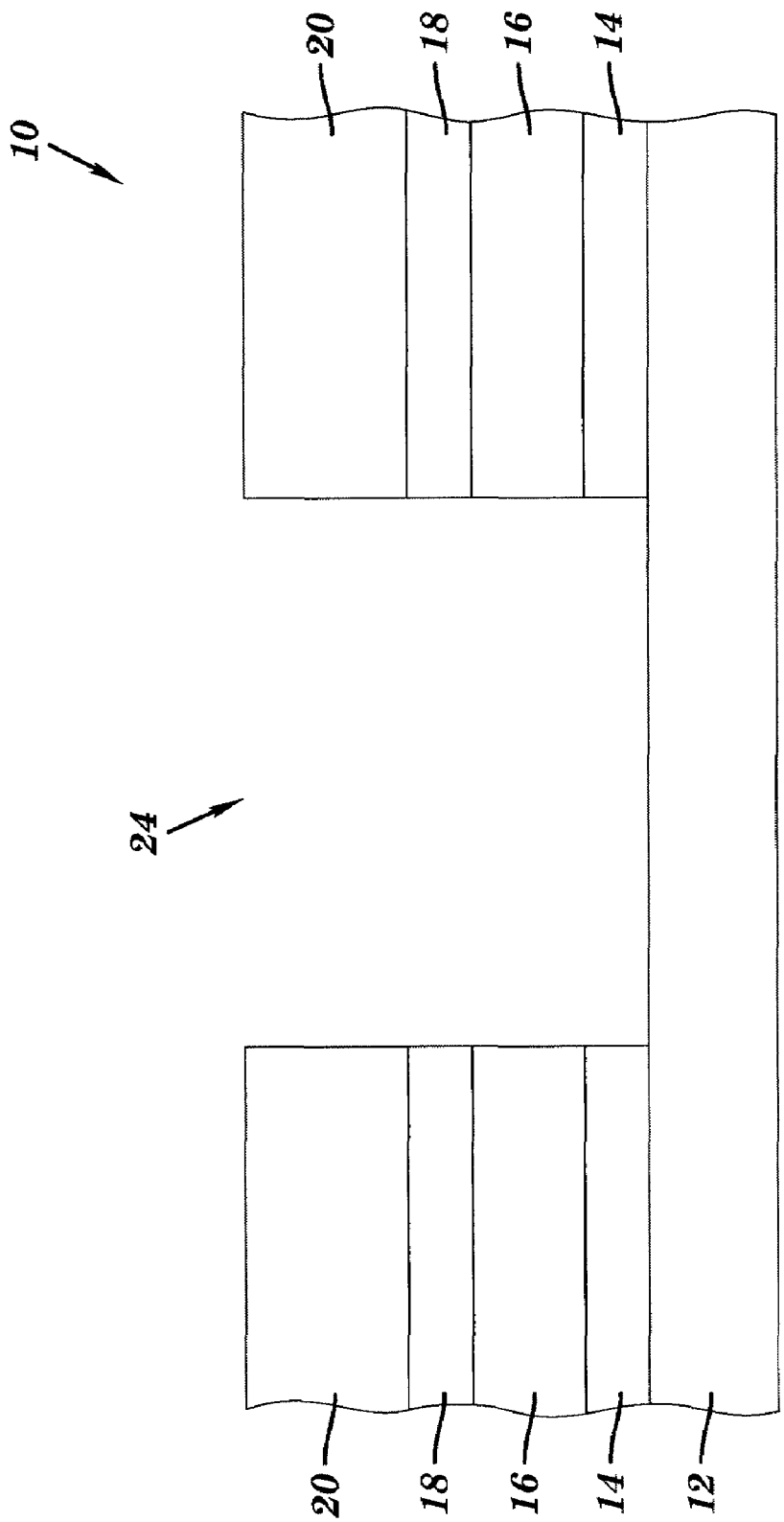

Referring to FIG. 4, after providing the mask 20 to the bonded substrate 10, the structure is subjected to one or more etching steps so as to form an opening 24 and expose a surface of the second semiconductor layer 12. Specifically, the one or more etching steps used at this point of the present invention removes the unprotected portions of the surface dielectric layer 18, as well as underlying portions of the first semiconductor layer 16, and a portion of the insulating layer 14 which separated the first semiconductor layer 16 from the second semiconductor layer 12. The etching may be performed utilizing a single etching process or multiple etching steps may be employed. The etching used at this point of the present invention may include a dry etching process such as reactive-ion etching, ion beam etching, plasma etching or laser etching, a wet etching process wherein a chemical etchant is employed or any combination thereof. In a preferred embodiment of the present invention, reactive-ion etching (RIE) is used in selectively removing the unprotected portions of the surface dielectric layer 18, the first semiconductor layer 16 and the insulating layer 14. The resultant structure after the etching process has been performed is shown, for example, in FIG. 4. Note that the sidewalls of the opening 24, i.e., the surface dielectric layer 18, the first semiconductor layer 16, the insulating layer 14 and the second semiconductor layer 12, are exposed after this etching step. As shown, the exposed sidewalls of layers 18, 16 and 14 are aligned with an outer most edge of mask 20.

Figure 5:
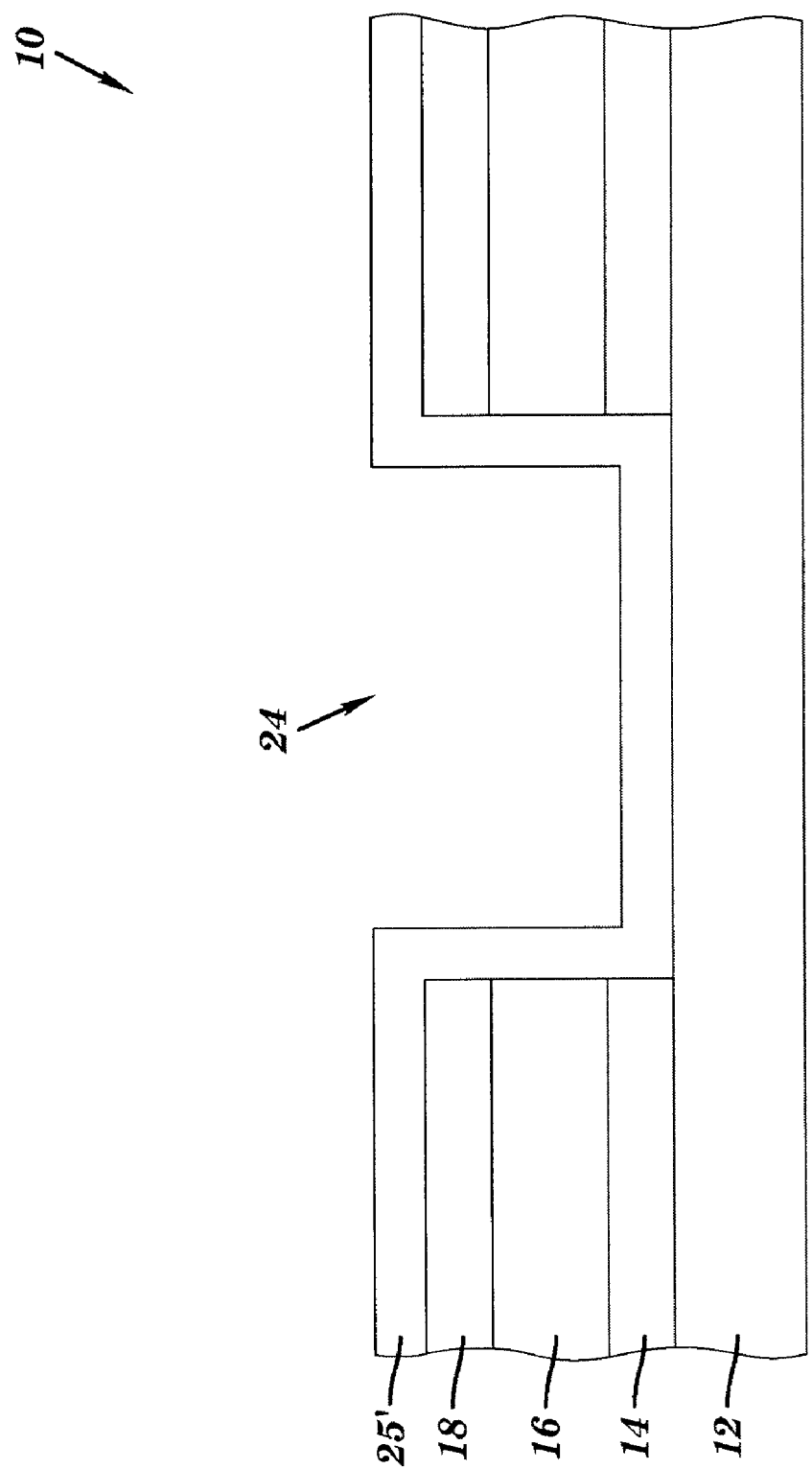

Next, spacers 25 are formed on the exposed sidewalls. The spacers 25 may be formed, for example, by conformally depositing an insulating layer 25' atop the mask 20, the sidewalls of the opening 24 (which defines the HOT window 24) and the exposed top surface of the second semiconductor layer 12, as illustrated in FIG. 5. The insulating layer 25' is preferably composed of an oxide.

Figure 6:
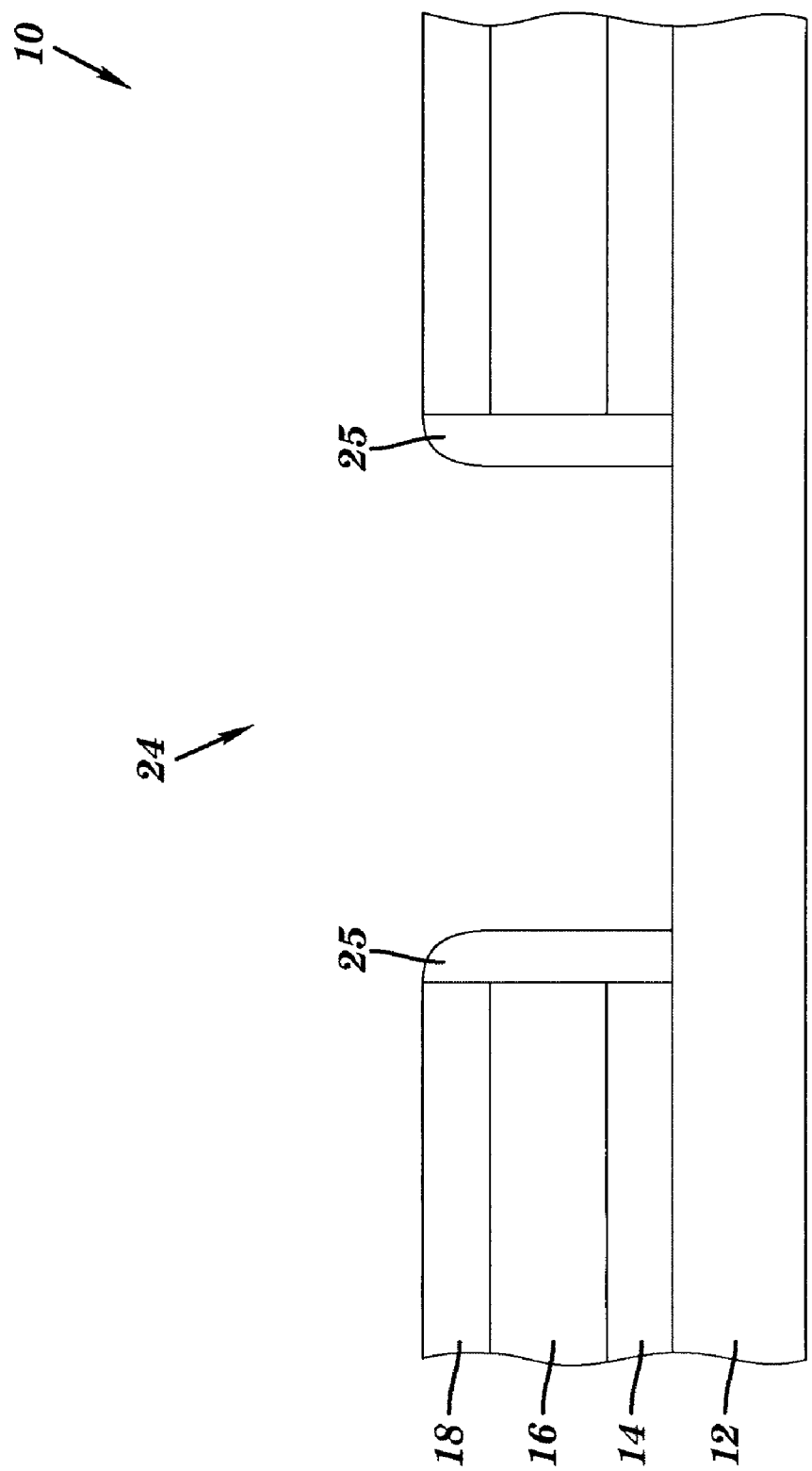

Next, and as shown in FIG. 6, spacers 25 are formed on the exposed sidewalls, for example, by directional etching, such as RIE.

Figure 7:
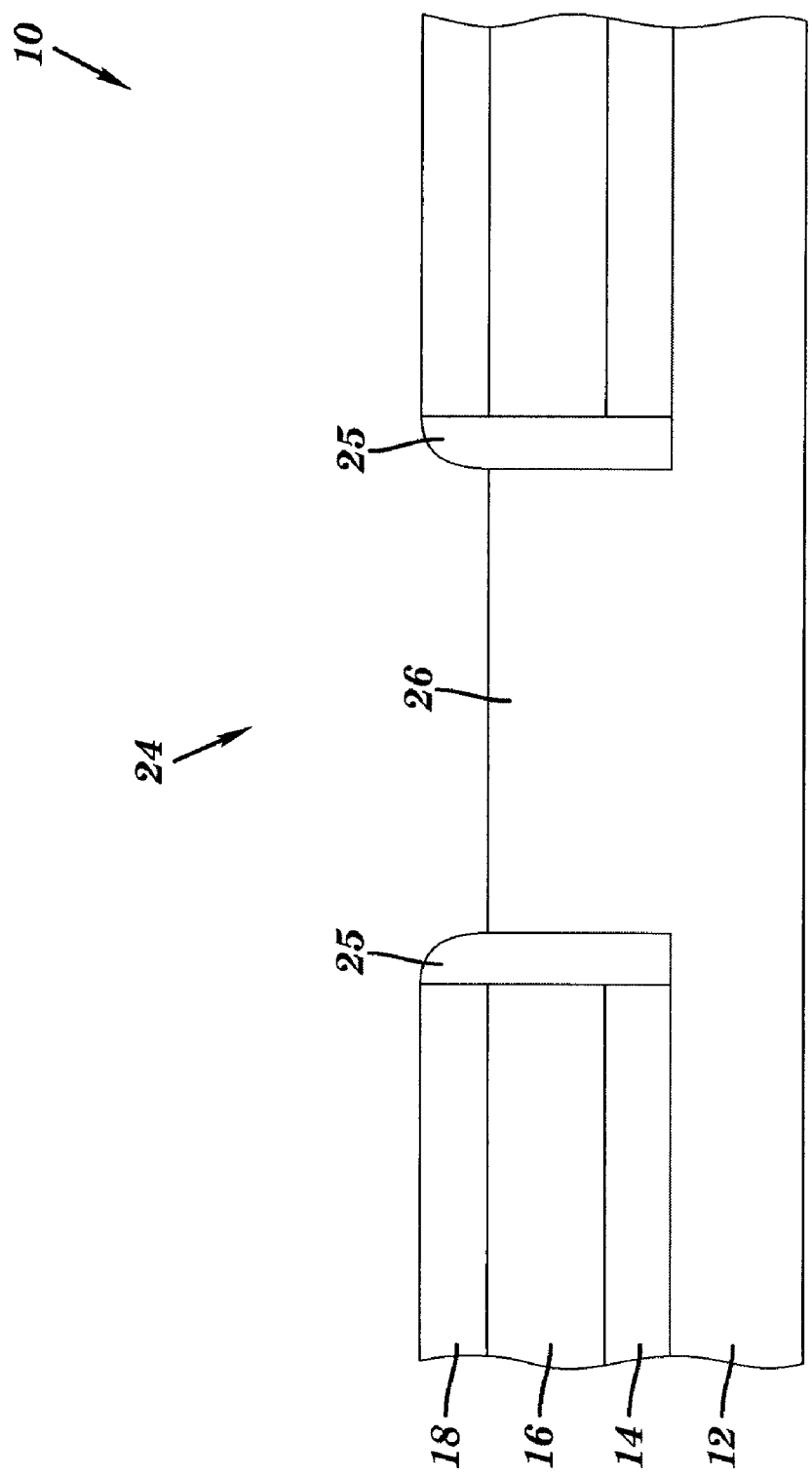

After formation of the spacers 25, semiconductor material 26 is formed on the exposed surface of the second semiconductor layer 12 providing the structure shown, for example, in FIG. 7. The semiconductor material 26 may be formed with a selective expitaxial process in the ambient of hydrogen, hydrochloric acid vapor, and silicon containing gas (silane) under pressure range of 100 mTorr to 500 Torr in the temperature range of 700 C.° to 1200 C.°. A typical epitaxial layer is overgrown to above layer 18 and planarized, for example, with a CMP process, followed by a recess process with silicon etch to align the grown epitaxial layer 26 with the first crystalline layer 16 as illustrated in FIG. 7. Insulating layer 18 is removed to provide the substantially planer structure shown in FIG. 8, which will permit further device fabrication. Note that the planarization step removes an upper portion of spacers 25 and the surface dielectric layer 18 that were not previously etched so as to provide a structure in which first semiconductor layer 16 is exposed and regrown semiconductor material 26 is exposed. The exposed first semiconductor layer 16 is the region in which a first semiconductor device such as an NFET will be formed, whereas the exposed surface of semiconductor material 26 is the region in which a second semiconductor device, such as a PFET, will be formed.

Figure 8:
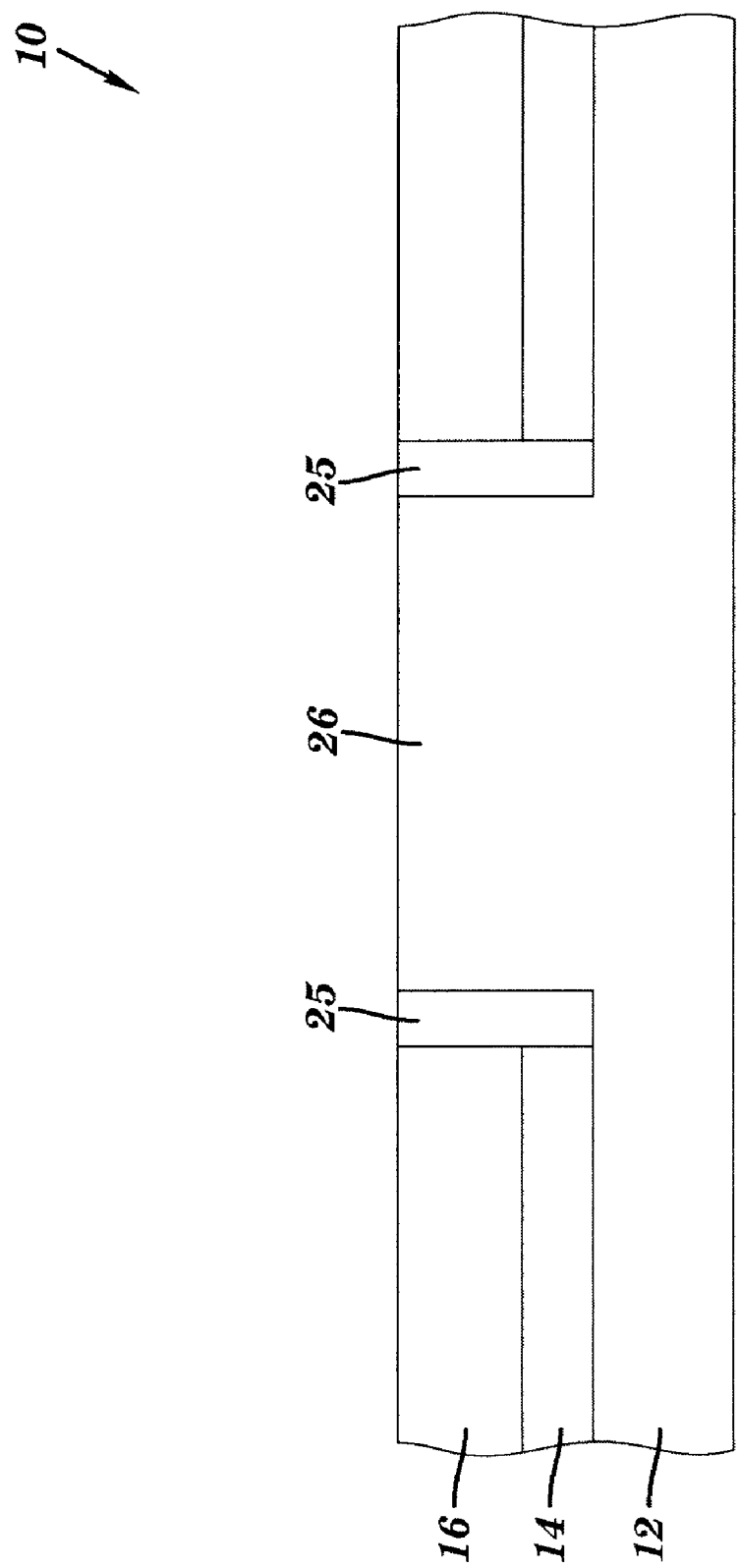
Figure 9:
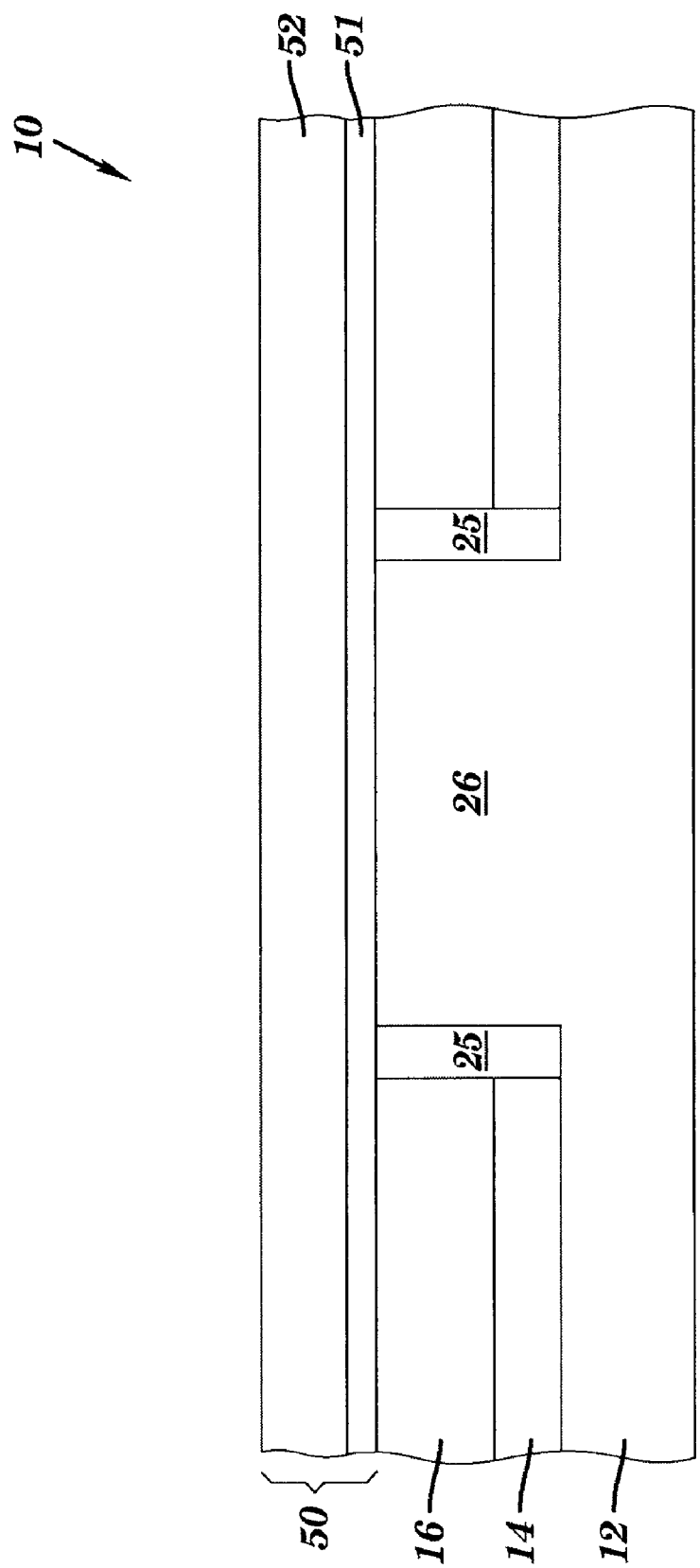

Next, and as shown in FIG. 9, a material stack 50 is formed atop the substantially planar structure shown in FIG. 8. The material stack 50 preferably comprises a pad oxide 51 and a pad nitride 52. The pad oxide 51 of the material stack 50 may be formed by either a thermal oxidation process or by deposition, while the pad nitride 52 may be formed by a LPCVD (Low Pressure Chemical Vapor Deposition) process in the ambient of ammonia and dichlorosilane. The pad nitride 52 is typically thicker than the underlying pad oxide 51. Pad oxide 51 is typically less than about 10 nm thick. Pad nitride 52 is typically in the range from about 70-150 nm thick.

Figure 10:
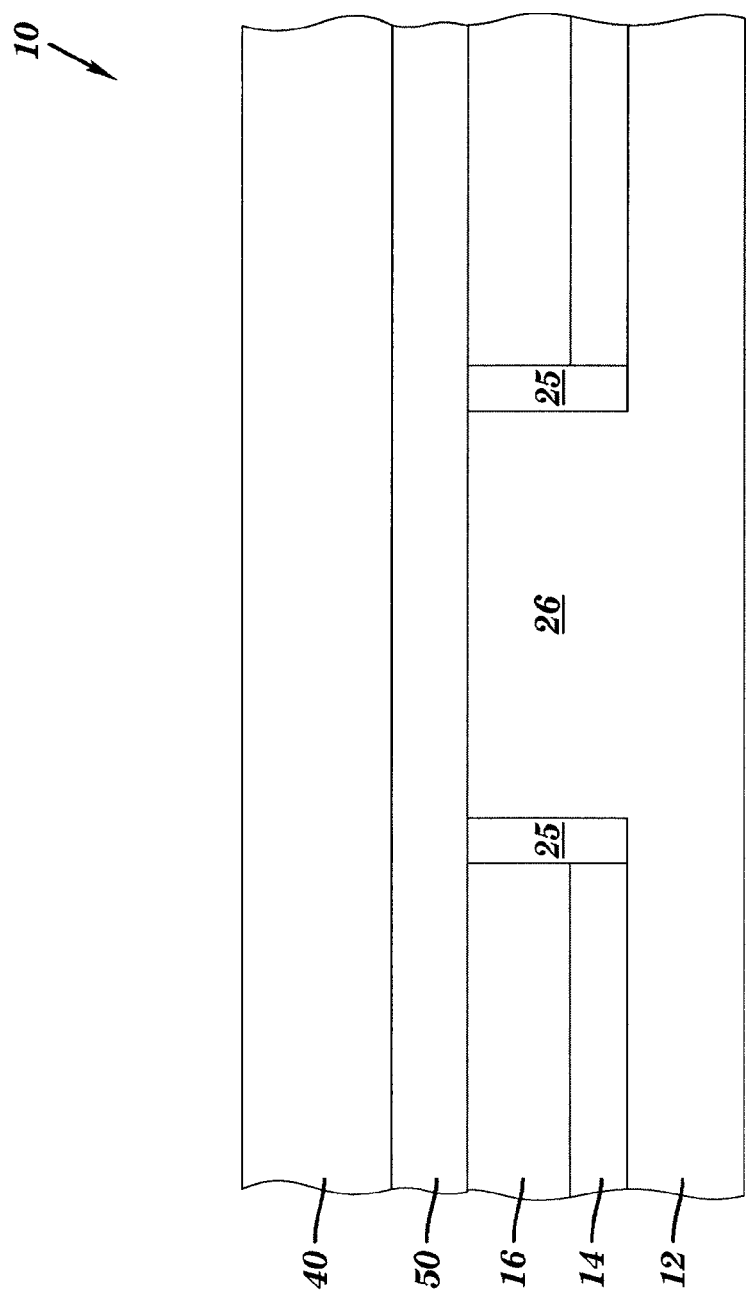

The material stack 50 is then patterned to define device and isolation structures. In one embodiment, a photoresist layer 40 may deposited atop the material stack 50, as illustrated in FIG. 10.

Figure 11:
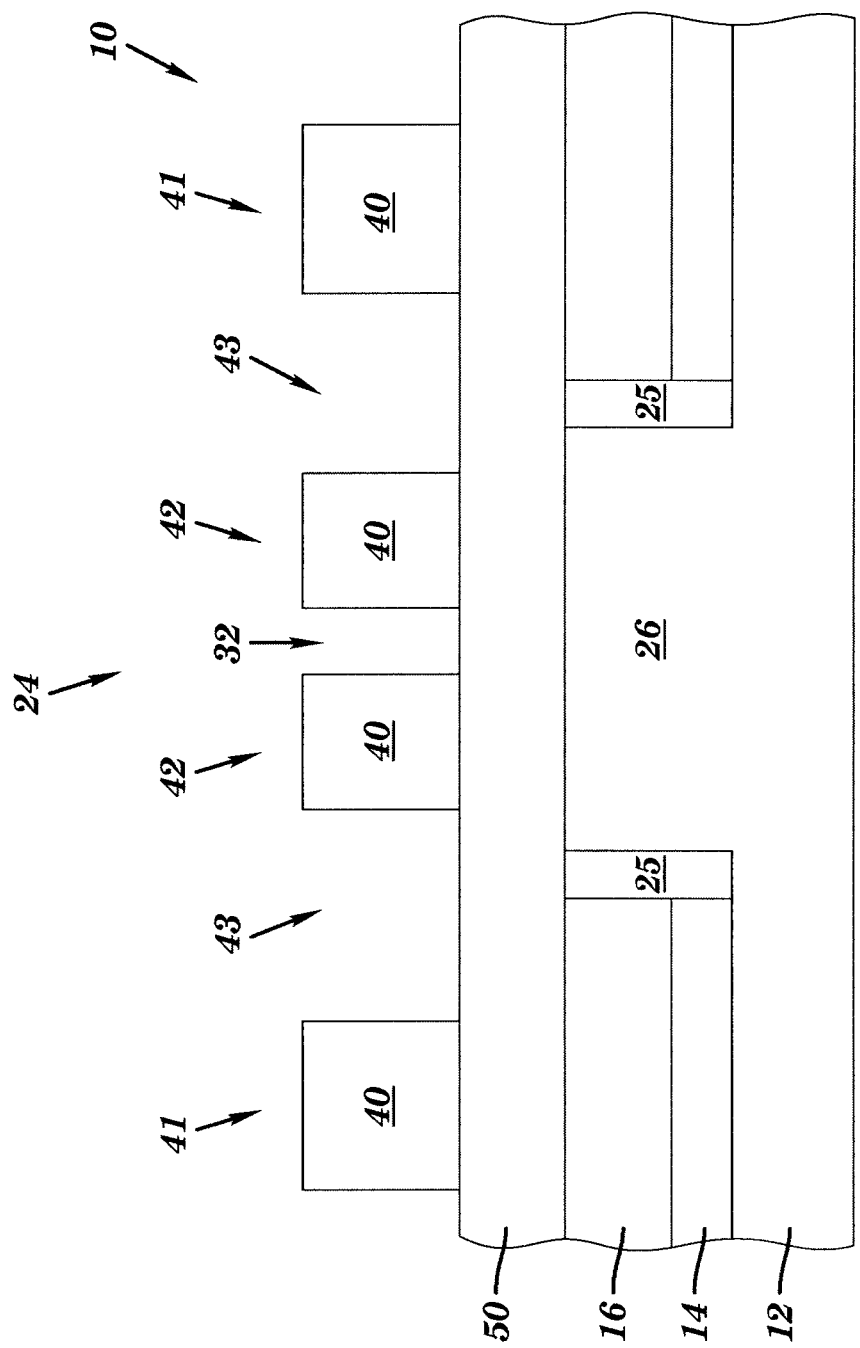

Next, the resist layer 40 is patterned to define active areas 41, 42 for device structures and isolation regions 43, 32 as illustrated in FIG. 11. Active regions 41 are defined for devices to be formed in the first semiconductor layer 16 having a first crystallographic orientation, such as an NFET. Active regions 42 are defined for devices to be formed in the second semiconductor layer 26 having second crystallographic orientation, i.e., in the HOT window region 24. Isolation regions 43 are defined between the devices on the first semiconductor layer 16 having first crystallographic orientation and the devices on the second semiconductor layer 26 having second crystallographic orientation. Isolation regions 32 are defined between devices within the window region 24 comprising the second semiconductor layer 26. Note that the patterning of the resist layer 40 will not be self-aligned to the HOT window region 24 due to the mechanical alignment that is typically required during lithographic processing.

Figure 12:
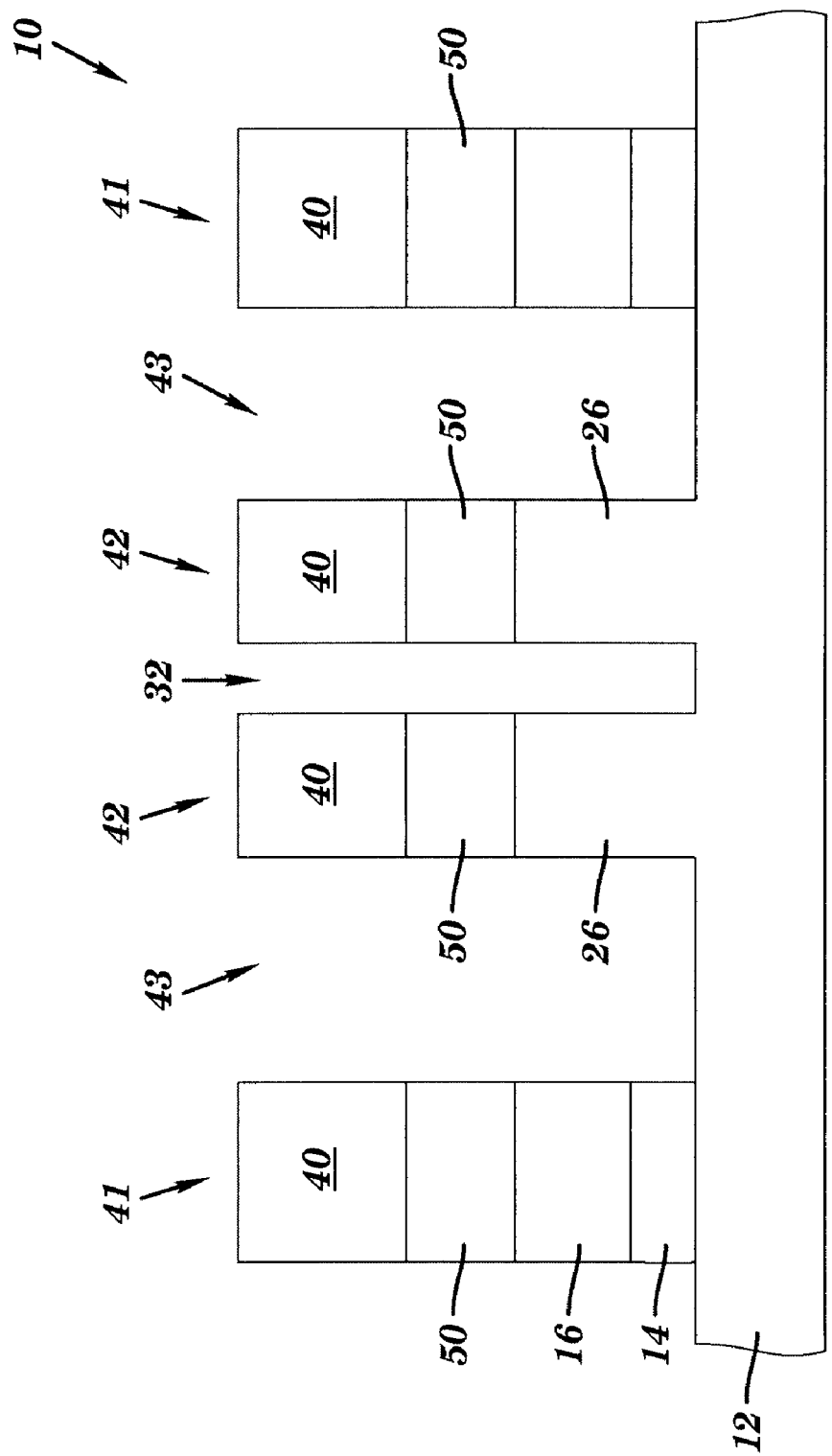
FIG. 12 illustrates in a cross section view, an ideal intermediate structure in forming a HOT semiconductor structure formed from FIG. 11, using as single etch step, but is difficult to control.

Next, isolation trenches, preferably defined by openings 43, 32, are formed, for example, by lithography and etching. Although it would be desirable to etch the material stack 50 (comprising pad oxide 51 and pad nitride 52), the first semiconductor layer 16, the spacers 25, the insulating layer 14 and the second semiconductor layer 26 in a single step in order to form the structure illustrated in FIG. 12, such a single step etch process is very difficult to control. For example, an etch process that etches all the above materials above (i.e. of material stack 50, the first semiconductor layer 16, the spacers 25, the insulating layer 14 and the second semiconductor layer 26) together is known to have some isotropic etch component as well as some vertical etch component. As a result, lateral dimensional control is not possible under smaller ground rules (i.e., for 65 nm or smaller technologies). Also, a much thicker resist would be required since such an etch would remove resist together with the other material.

Figure 13A:
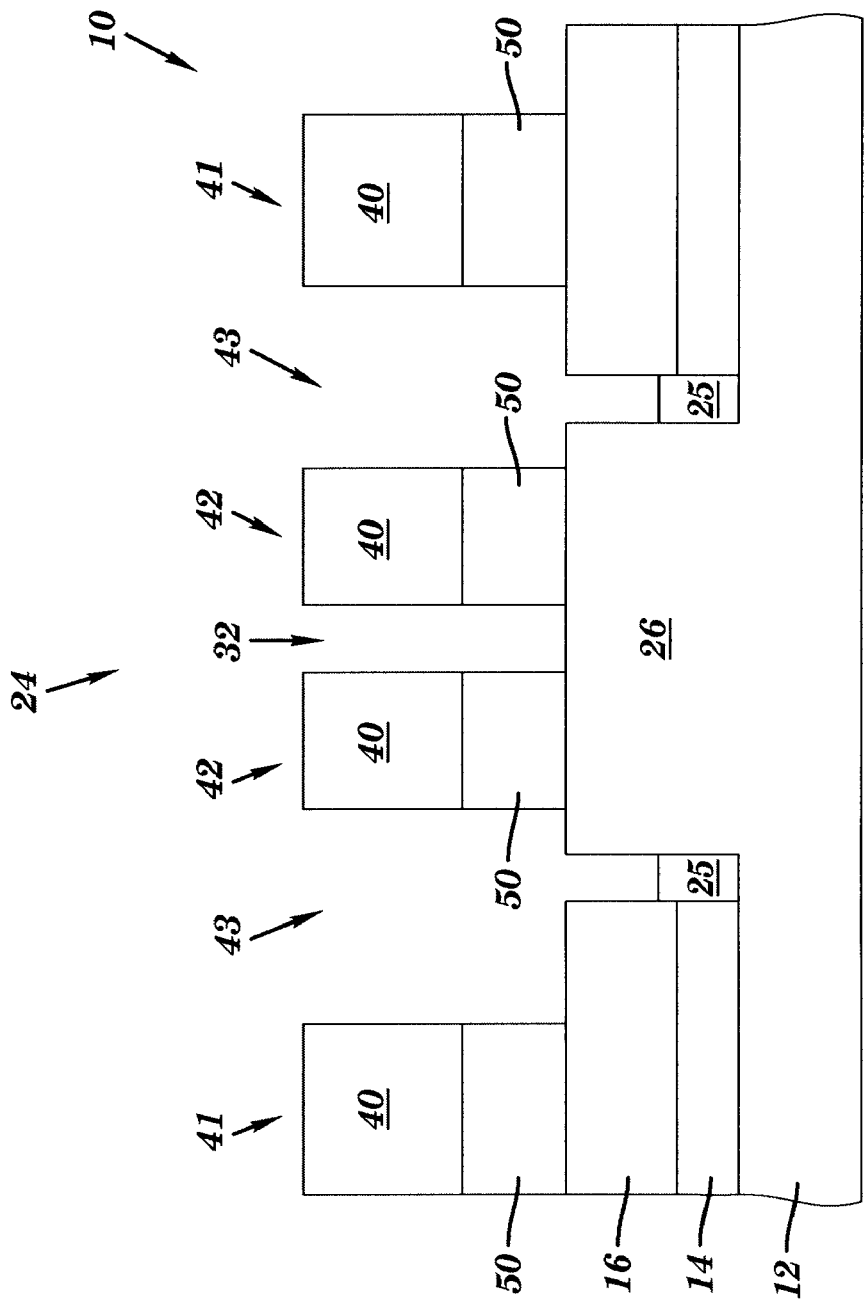
FIG. 13A illustrates a cross-section of a HOT semiconductor structure after an etch of insulating material, selective to semiconductor material, in accordance with the invention.

In accordance with the present invention, a multi-step etch process is performed. According to one embodiment, first, the material layer 50, which preferably comprises pad oxide layer 51 and pad nitride layer 52 (see FIG. 9), is removed to expose the second semiconductor layer 26, using an anisotropic etch of the insulator selective to the semiconductor material layers 16 and 26, for example, using a carbon and fluorine containing etch environment. In addition, the oxide spacers 25 will be recessed below the surface of the semiconductor layers 16 and 26, during this etch step. The depth of the recess of spacers 25 may be controlled by over etching of materials 51 and 52, as known in the art. Preferably, the depth of the recess of spacers 25 is about 50 nm below the surface of the semiconductor layers 16 and 26. The height of the spacers 25 will be now substantially similar to the thickness of the insulating layer 14, preferably within about ±20 nm. The resulting structure is illustrated in FIG. 13A.

Figure 13B:
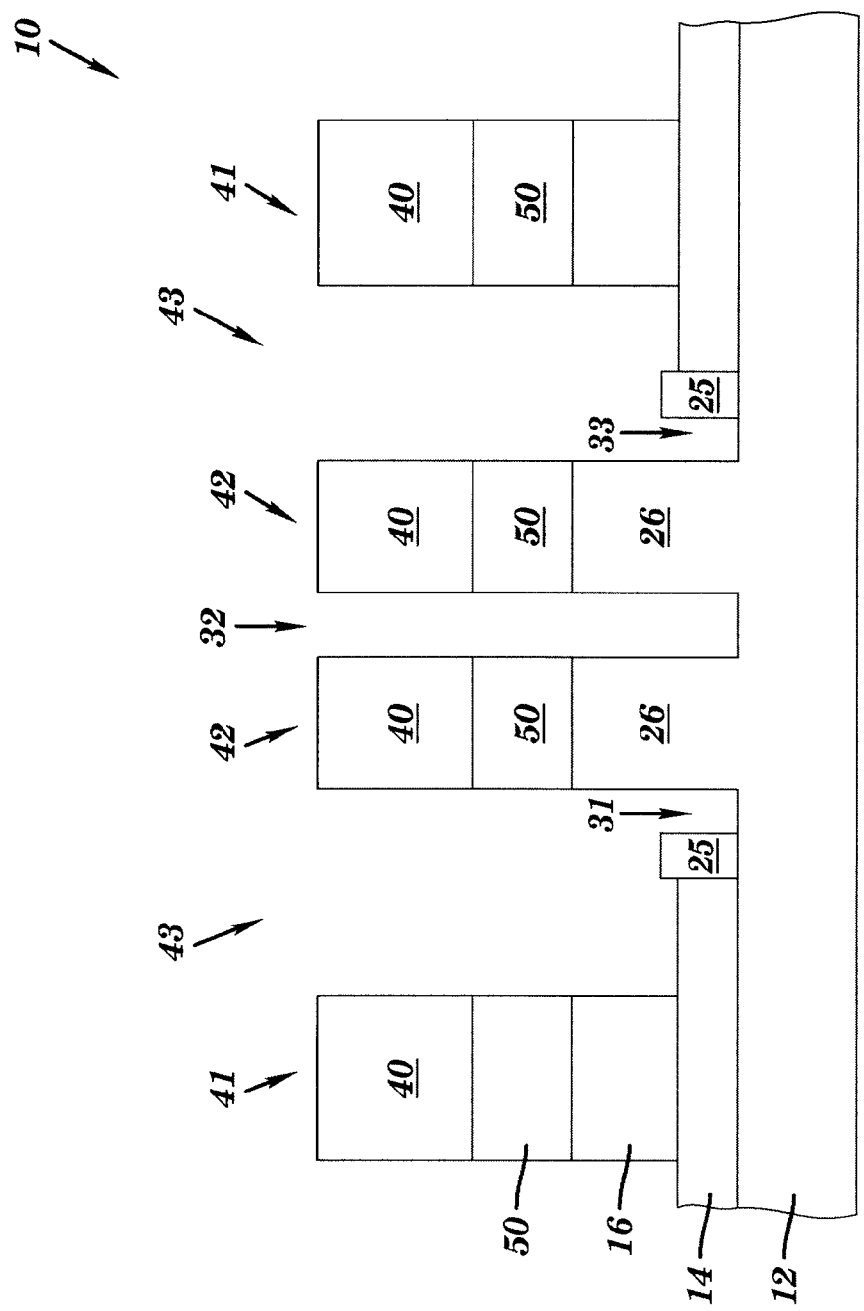
FIG. 13B illustrates a cross-section of a HOT semiconductor structure after an etch of semiconductor material, selective to insulating material, in accordance with the invention.

Next, the first semiconductor layer 16 and the second semiconductor layer 26 are etched selective to oxide, nitride and resist, for example, using a hydrobromic acid containing etch environment. As a result, the use of a thinner resist is possible. In addition, the inventive multi-step process also provides good lateral dimension control, which is desirable for smaller ground rule technology (i.e. at or smaller than 65 nm technologies). The resulting structure is illustrated in FIG. 13B.

Note that since the patterning of resist layer 40 is not self-aligned to the HOT region 24, the selective etch of semiconductor layers 16 and 26 may result in uneven gaps 31 and 33 between the gate stacks 42 within the HOT region 24 and the spacers 25.

Figure 14:
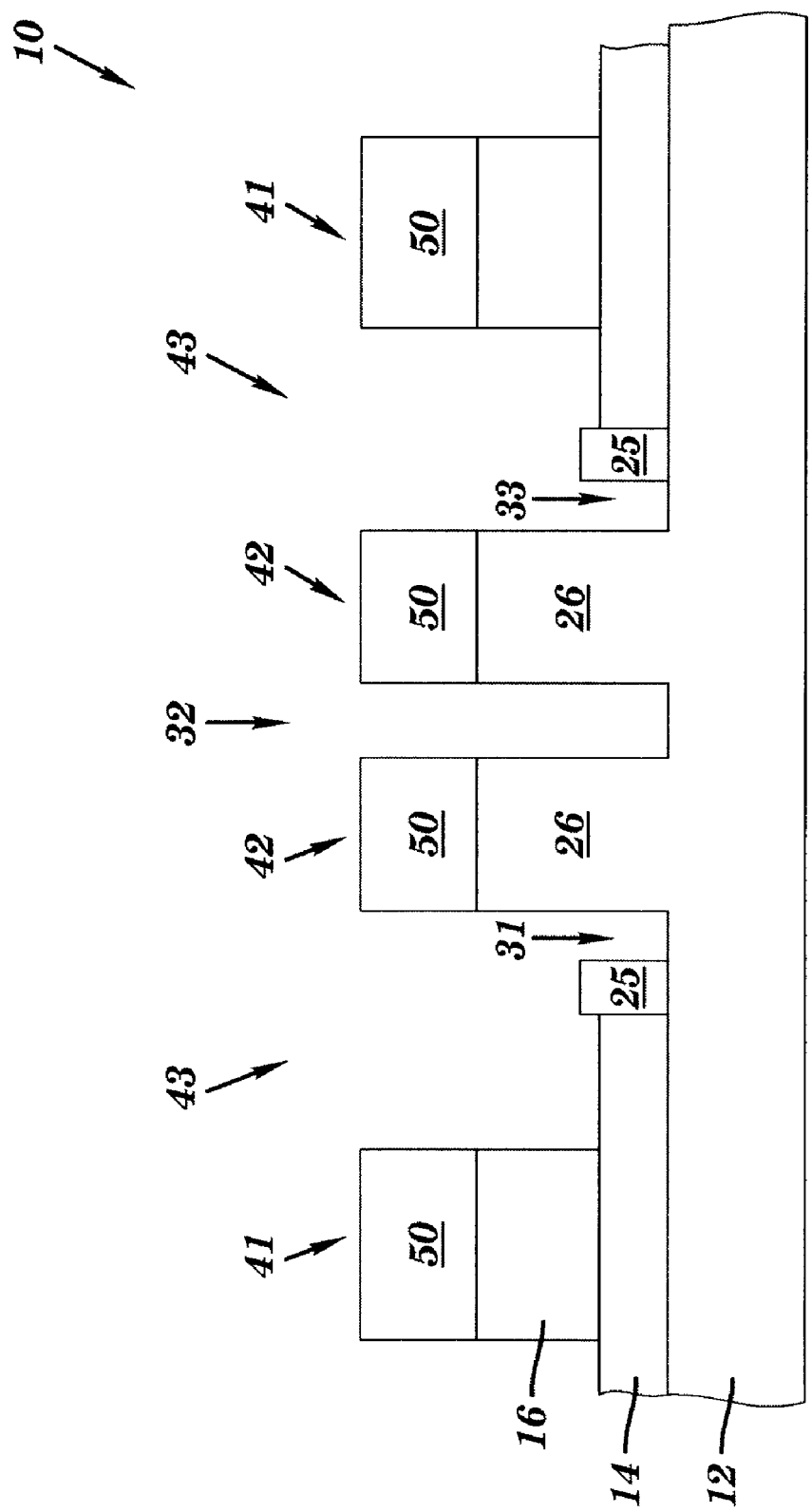
FIGS. 14-20 illustrates, in cross section views, process steps in forming a HOT semiconductor structure following the step of FIG. 13B.

Next, the photoresist layer 40 is removed, and the resulting structure is illustrated in FIG. 14.

Figure 15:
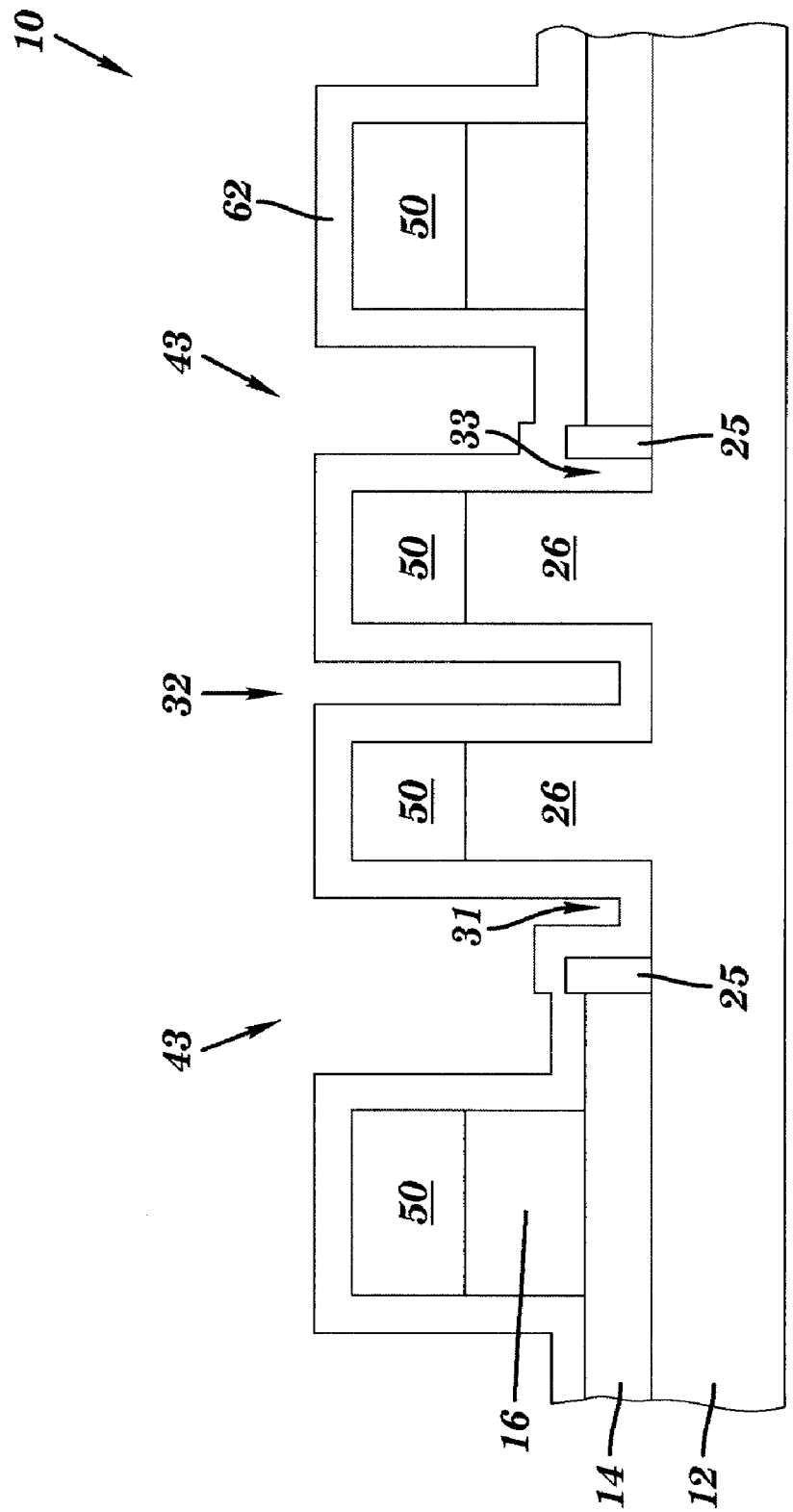

In accordance with the invention, the isolation regions 43, 32 are filled with an oxide, preferably by a high density plasma (HDP) deposition. HDP oxide is preferred due to its slower wet etch rate in an HF containing solution compared to other types of oxide. If the aspect ratio of gaps 31, 33 are too large, i.e. the ratio of height to width is greater than ~3:1, then the gaps may not be reliably filled by HDP deposition alone. Thus, preferably, a conformal oxide layer 62 is deposited over the structure 10. Preferably the conformal oxide layer 62 is formed by high temperature CVD oxide (HTO) using $SiH_4$ and $O_2$ gas in a low pressure range of 10-500 mTorr, preferably in the range 300 mTorr-400 mTorr. The resulting structure is illustrated in FIG. 15.

Figure 16:
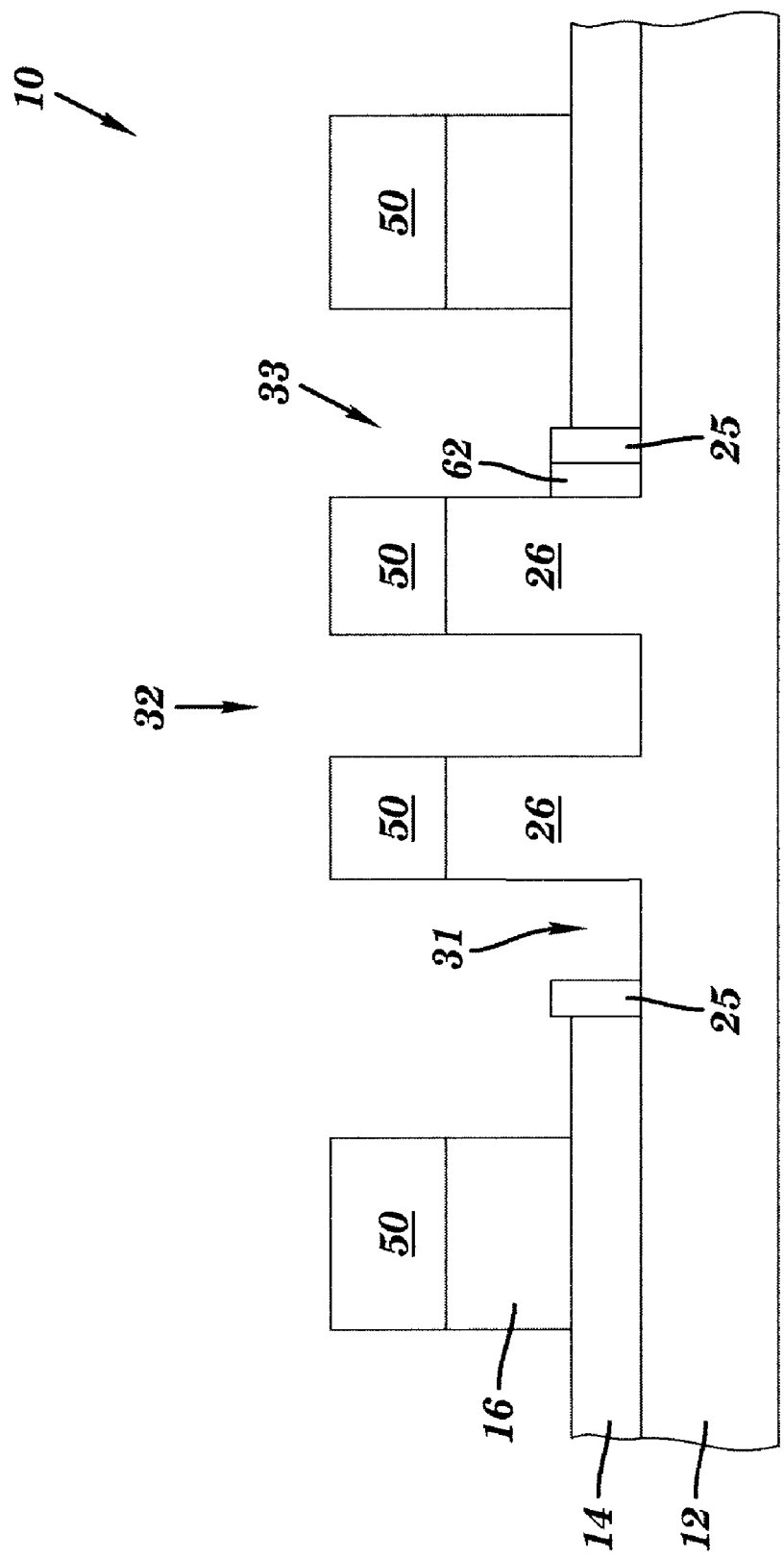

Although the conformal oxide layer 62 will fill the sub-ground rule gaps 33, the conformal oxide layer may have reduced other gaps (e.g. gap 31) to a width so that the aspect ratio of the partially filled gap 31 is greater than the capability of HDP to fill the gap reliably. Thus, the conformal oxide layer 62 is removed (etched back) to restore the fill aspect ratio for the larger gaps (e.g. gap 31) to an aspect ratio less than 3:1, for example, by an isotropic etch from the surfaces of the structure 10, except where previously filled sub-ground rule gaps 33 have been filled. The etch back can be done in diluted HF solution, for example, 40:1 or 100:1, with a removal target of about the thickness of the conformal oxide 62. The resulting structure is illustrated in FIG. 16.

Figure 17:
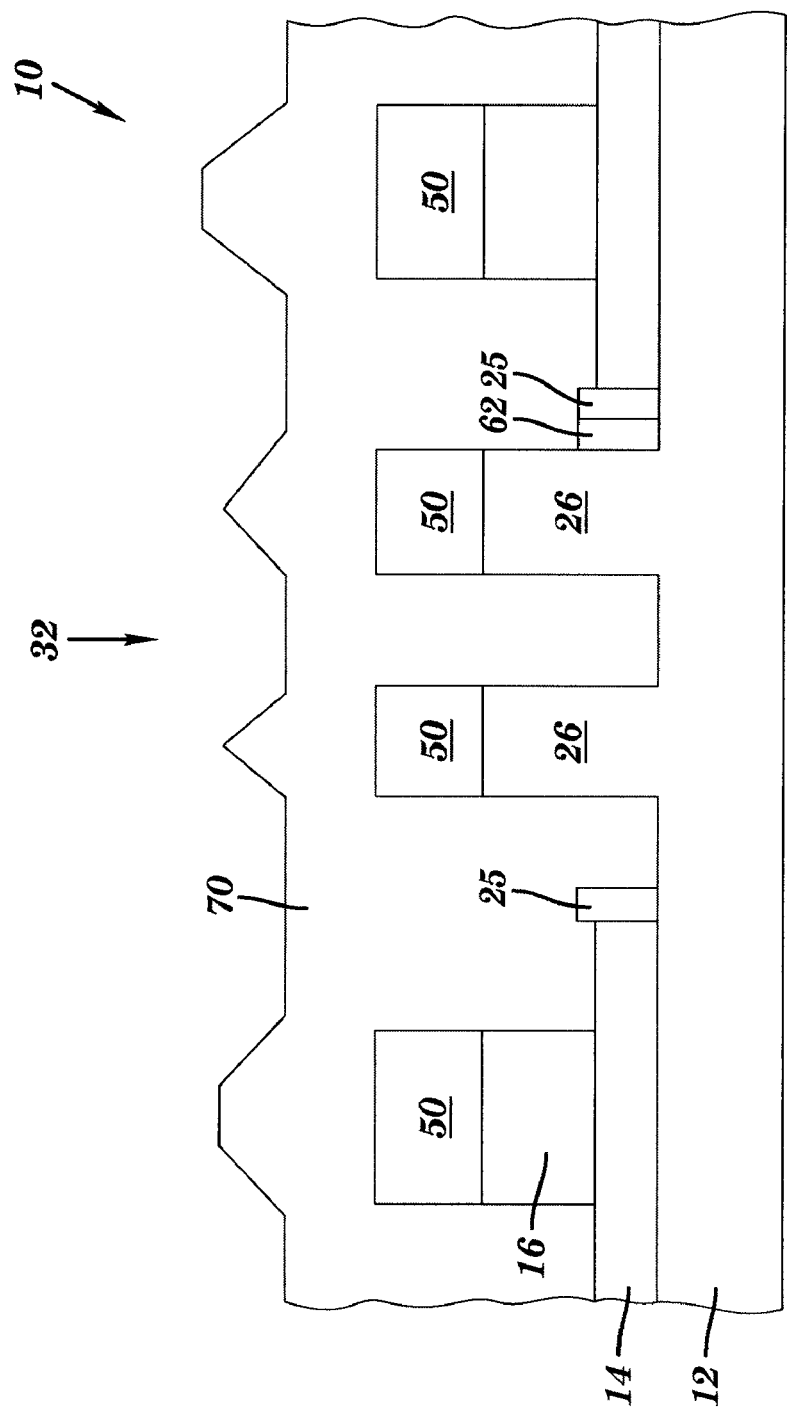
Figure 18:
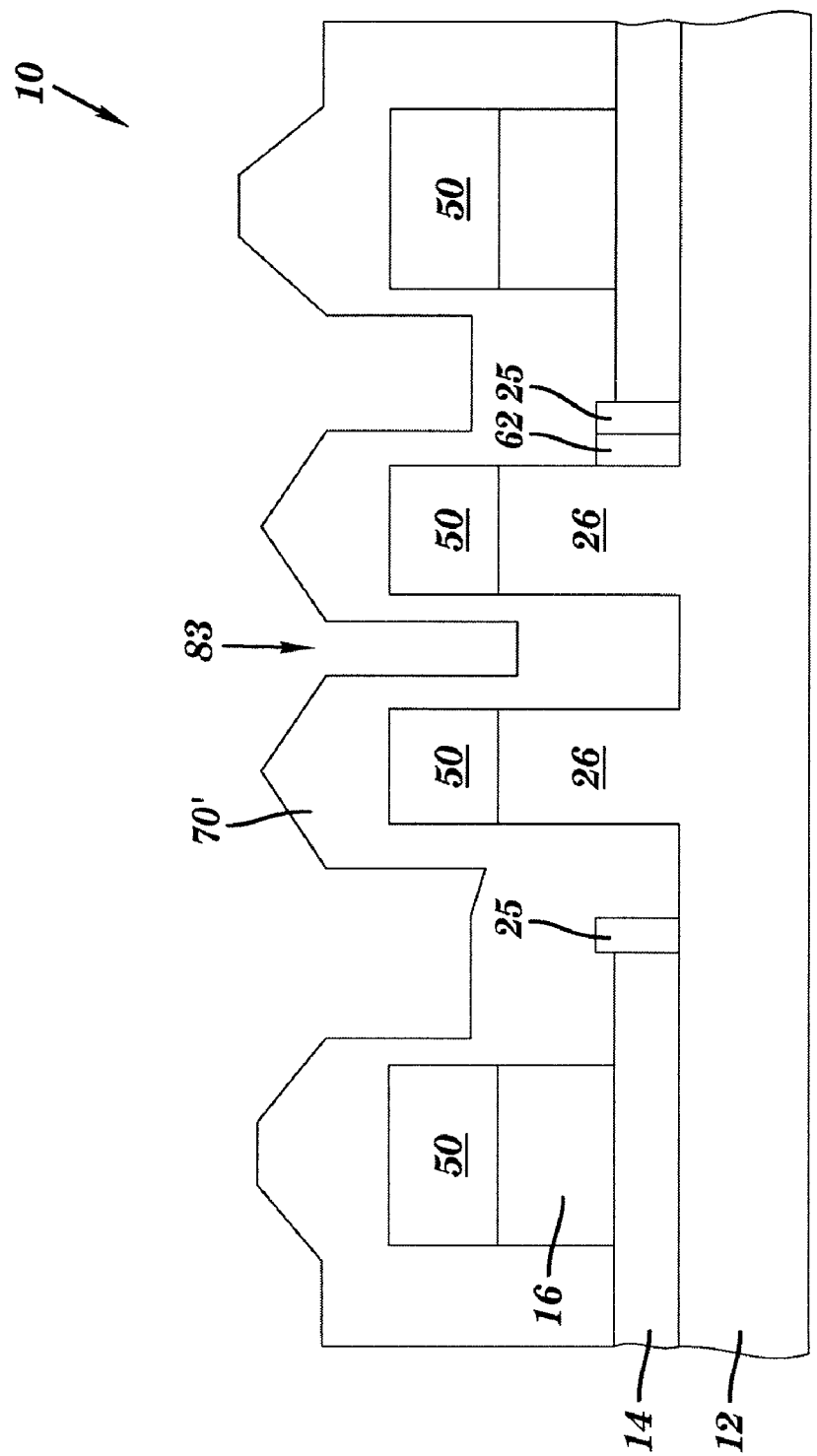

Next, a layer of oxide 70 is deposited, preferably using high density plasma (HDP) deposition as illustrate in FIG. 17. However, depending on the ground rule, the HDP oxide might not be able to fill the gaps with one time deposition. This situation happens, for example, for STI isolation 32 between active devices in the HOT region. In this particular example with a ground rule of 65 nm or smaller, more than one HDP deposition may used as explained below. Thus, referring to FIG. 18, a first HDP deposition resulting in first HDP layer 70' may result in a high aspect ratio (>3:1) gap 83 in the first HDP layer 70'. Therefore, in accordance with the invention, if a first HDP layer 70' is not sufficient to completely fill the remaining gaps then an isotropic etch is performed to remove (or clean) an upper layer of the first HDP layer 70', for example, by wet etch comprising an HF solution, followed by a subsequent HDP fill resulting in a structure similar to that illustrated in FIG. 17. The steps of HDP clean and deposition may be repeated as necessary to provide a completely gap-free HDP fill.

Figure 19:
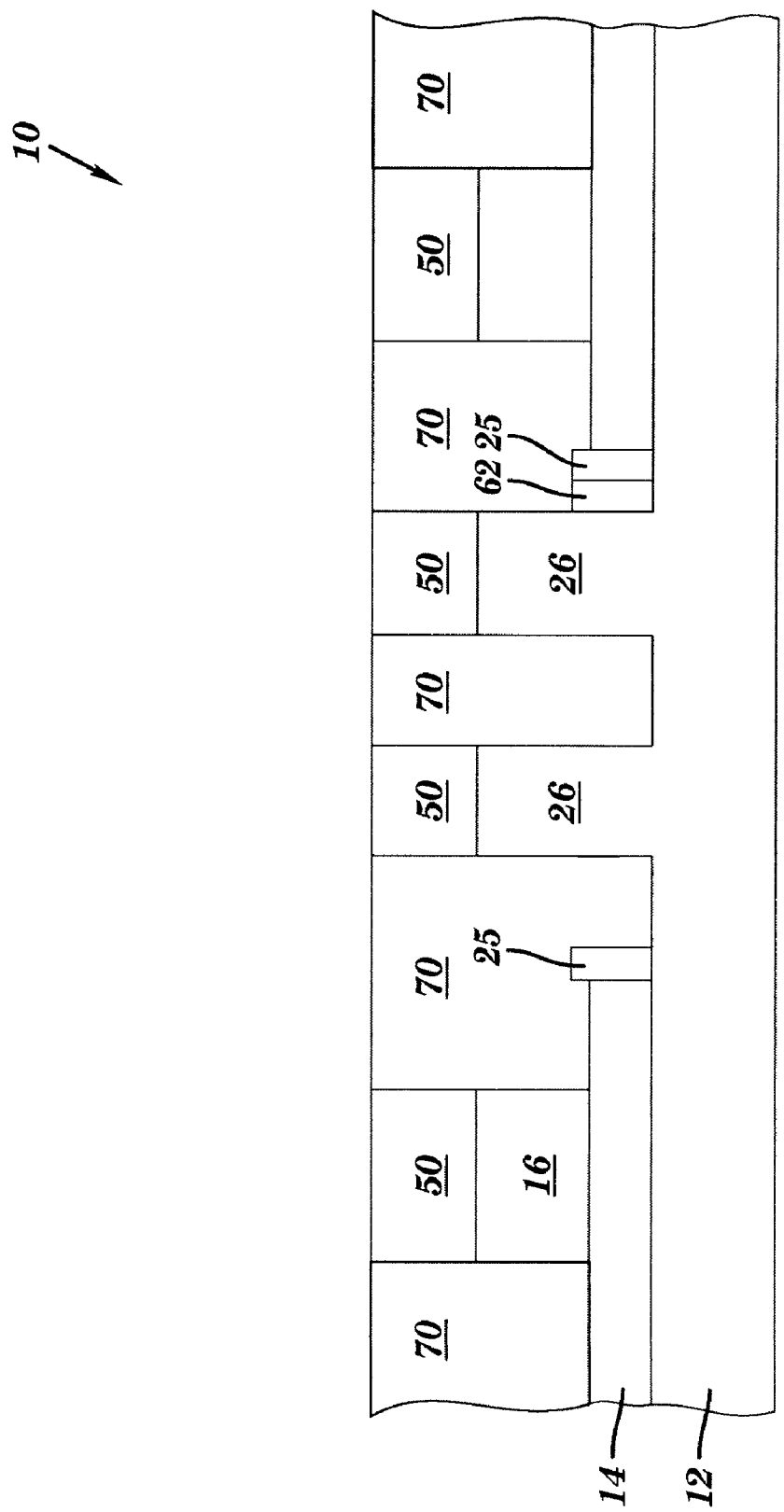

The HDP oxide layer 70 is then planarized, for example, by CMP, stopping on the material layer 50 (i.e. the pad nitride 52). The CMP may be done once or preferably twice (2 step CMP) with a different CMP polishing pad each time. However, this invention is not limited to any particular CMP method. The resulting structure is illustrated in FIG. 19.

Figure 20:
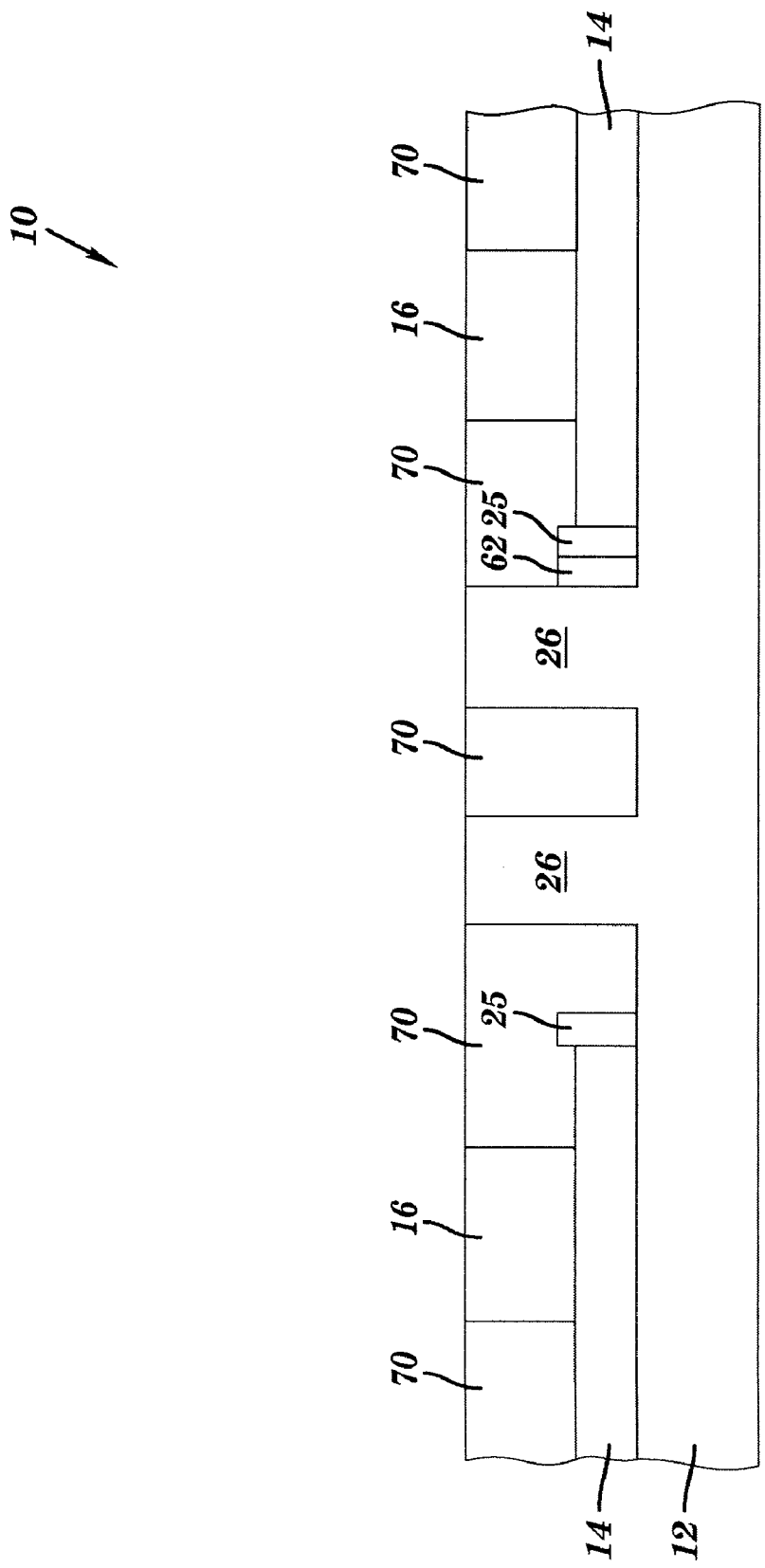

For the final structure of FIG. 20, where semiconductor layers 16, 26 and STI oxide 70 are planarized, some of the HDP oxide 70 must be removed before nitride layer 52 (material layer 50 includes pad nitride 52 on top of pad oxide layer 51). For example, the HDP oxide 70 may be removed by a deglaze in diluted HF containing solution using a timed etch to recess the HDP oxide 70 to about co-planar with the top of the pad oxide layer 51. This is followed by removal of the pad nitride layer 52 by a timed etch using hot phosphoric acid ($H_3PO_4$) solution. Then another timed etch is performed using a dilute HF containing solution, to remove the pad oxide 51 and also an upper portion of the HDP oxide 70, to result in a planar surface as illustrated in FIG. 20.

The structure in FIG. 20 is ready for device fabrication, where devices of a first type are formed on the semiconductor layer 16 having first crystallographic orientation, and devices of a second type are formed on the second semiconductor layer 26 having a second crystallographic orientation.

The method described so far realizes HOT structure, having one type of device on SOI with one type of crystal orientation and another type of device on a substrate with a different crystal orientation. In particular with the method described above, with integration of a multi-step STI etch selective to oxide, followed by conformal CVD oxide gap fill, allows smaller ground rule (at or smaller than about 65 nm) dimension control and STI fill in manufacturing friendly manner.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What we claim is:

1. A method of forming a semiconductor structure comprising the steps of:
    providing a substrate comprising a semiconductor on insulator (SOI) region comprising a first semiconductor material on a buried insulating layer, adjacent a bulk semiconductor region comprising a second semiconductor material, said SOI region separated from said bulk region by an insulating spacer;
    forming an insulating material layer atop said SOI region, said bulk region and said insulating spacer;
    forming a patterned mask over said insulating material layer comprising an isolation opening that exposes a region of said insulating material layer that defines an isolation region between said SOI region and said bulk semiconductor region, said isolation opening formed over said insulating spacer;
    performing a first etch to remove said exposed regions of said insulating material layer and an upper portion of said insulating spacer, to expose portions of said first semiconductor material and said second semiconductor material in said isolation opening, said first etch being selective to said first and second semiconductor materials, and so that said insulating spacer is recessed below the upper surfaces of said first and second semiconductor materials;
    then performing a second etch to remove said exposed portions of said first semiconductor material and said semiconductor material to expose portions of said buried insulating layer in said isolation opening, said second etch being selective to said insulating material layer, said buried insulating layer and said insulating spacer, such that a high aspect ratio gap, having an aspect ratio equal to or greater than about 3:1, is formed between a sidewall of said insulating spacer and said second semiconductor material;
    filling said high aspect ratio gap with a CVD oxide; and
    then filling the isolation opening with an HDP oxide to form an isolation region so that there are no voids in said isolation region.

2. The method of claim 1 wherein said step of filling said isolation opening comprises depositing a first HDP oxide layer on said substrate, and if an unfilled gap remains having an aspect ratio equal to or greater than about 3:1, then removing an upper portion of said first HDP oxide layer so that the aspect ratio of said unfilled gap is less than about 3:1, and then depositing a second HDP oxide layer on said substrate.

3. The method of claim 1 wherein said insulating material layer comprises a pad oxide layer atop said SOI region, said bulk region and said oxide spacer, and further comprises a pad nitride layer atop said pad oxide layer.

4. The method of claim 1 wherein said step of filling said high aspect ratio gap with a CVD oxide comprises depositing on said substrate a conformal CVD oxide layer having a thickness sufficient to fill said high aspect ratio gap, and then removing said conformal CVD oxide layer from the surface of said substrate, while leaving said high aspect ratio gap filled with said CVD oxide.

5. The method of claim 1, further comprising removing an upper portion of said HDP oxide and said insulating material layer so that the upper surfaces of said first semiconductor material, said second semiconductor material and said HDP oxide are substantially co-planar.

6. The method of claim 5, further comprising forming a first type of semiconductor device on said first semiconductor material and a second type of semiconductor device on said first semiconductor material.

7. The method of claim 1, wherein said first semiconductor material has a first crystallographic orientation and said second semiconductor material has a second crystallographic orientation different from said first crystallographic orientation.

8. The method of claim 1 wherein said insulating spacer is recessed to a depth so that the height of said insulating spacer is substantially similar to the thickness of said buried insulating layer.

9. The method of claim 8, wherein the height of said insulating spacer is within about ±20 nm of the thickness of said buried insulating layer.

10. A method of forming a semiconductor structure comprising the steps of:
    providing a substrate comprising a semiconductor on insulator (SOI) region comprising a first semiconductor material on a buried oxide (BOX) layer, adjacent a bulk semiconductor region comprising a second semiconductor material, said SOI region separated from said bulk region by an oxide spacer;
    forming an insulating material layer atop said SOI region, said bulk region and said oxide spacer;
    forming a patterned mask over said insulating material layer comprising an isolation opening that exposes a region of said insulating material layer that defines an isolation region between said SOI region and said bulk semiconductor region, said isolation opening formed over said oxide spacer;
    performing a first etch to remove said exposed regions of said insulating material layer and an upper portion of said oxide spacer, to expose portions of said first semiconductor material and said second semiconductor material in said isolation opening, said first etch being selective to said first and second semiconductor materials, and so that said oxide spacer is recessed below the upper surfaces of said first and second semiconductor materials;

then performing a second etch to remove said exposed portions of said first semiconductor material and said semiconductor material to expose portions of said BOX in said isolation opening, said second etch being selective to said insulating material layer, said BOX layer and said oxide spacer, such that a high aspect ratio gap, having an aspect ratio equal to or greater than about 3:1, is formed between a sidewall of said oxide spacer and said second semiconductor material;

filling said high aspect ratio gap with a CVD oxide; and then filling the isolation opening with an HDP oxide to form an isolation region so that there are no voids in said isolation region.

11. The method of claim 10 wherein said step of filling said isolation opening comprises depositing a first HDP oxide layer on said substrate, and if an unfilled gap remains having an aspect ratio equal to or greater than about 3:1, then removing an upper portion of said first HDP oxide layer so that the aspect ratio of said unfilled gap is less than about 3:1, and then depositing a second HDP oxide layer on said substrate.

12. The method of claim 10 wherein said insulating material layer comprises a pad oxide layer atop said SOI region, said bulk region and said oxide spacer, and further comprises a pad nitride layer atop said pad oxide layer.

13. The method of claim 10 wherein said step of filling said high aspect ratio gap with a CVD oxide comprises depositing on said substrate a conformal CVD oxide layer having a thickness sufficient to fill said high aspect ratio gap, and then removing said conformal CVD oxide layer from the surface of said substrate, while leaving said high aspect ratio gap filled with said CVD oxide.

14. The method of claim 10, further comprising removing an upper portion of said HDP oxide and said insulating material layer so that the upper surfaces of said first semiconductor material, said second semiconductor material and said HDP oxide are substantially co-planar.

15. The method of claim 14, further comprising forming a first type of semiconductor device on said first semiconductor material and a second type of semiconductor device on said first semiconductor material.

16. The method of claim 10, wherein said first semiconductor material has a first crystallographic orientation and said second semiconductor material has a second crystallographic orientation different from said first crystallographic orientation.

17. The method of claim 10 wherein said oxide spacer is recessed to a depth so that the height of said oxide spacer is substantially similar to the thickness of said BOX layer.

18. The method of claim 17, wherein the height of said oxide spacer is within about ±20 nm of the thickness of said BOX layer.

* * * * *